(12) United States Patent
Campbell et al.

(10) Patent No.: US 8,144,467 B2
(45) Date of Patent: Mar. 27, 2012

(54) DEHUMIDIFYING AND RE-HUMIDIFYING APPARATUS AND METHOD FOR AN ELECTRONICS RACK

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 12/787,839

(22) Filed: May 26, 2010

(65) Prior Publication Data
US 2011/0292601 A1 Dec. 1, 2011

(51) Int. Cl.
*H05K 7/20* (2006.01)

(52) U.S. Cl. ........ 361/699; 361/696; 361/698; 361/700; 361/701; 361/702; 165/80.4; 165/104.33; 62/259.2

(58) Field of Classification Search .................. None
See application file for complete search history.

(56) References Cited

U.S. PATENT DOCUMENTS

| | | | |
|---|---|---|---|
| 3,740,959 A | 6/1973 | Foss | |
| 4,011,905 A | 3/1977 | Millard | |
| 4,135,370 A | 1/1979 | Hosoda et al. | |
| 4,952,283 A | 8/1990 | Besik | |
| 5,056,593 A | 10/1991 | Hull | |
| 5,131,233 A | 7/1992 | Cray et al. | |
| 5,285,347 A | 2/1994 | Fox et al. | |
| 5,467,250 A | 11/1995 | Howard et al. | |
| 5,613,372 A * | 3/1997 | Beal et al. | 62/434 |
| 5,731,954 A | 3/1998 | Cheon | |
| 5,934,368 A * | 8/1999 | Tanaka et al. | 165/233 |
| 5,970,731 A | 10/1999 | Hare et al. | |
| 6,164,369 A | 12/2000 | Stoller | |
| 6,176,098 B1 * | 1/2001 | Moriguchi | 62/259.2 |
| 6,205,796 B1 | 3/2001 | Chu et al. | |
| 6,272,016 B1 | 8/2001 | Matonis et al. | |
| 6,377,453 B1 | 4/2002 | Belady | |
| 6,462,944 B1 | 10/2002 | Lin | |

(Continued)

OTHER PUBLICATIONS

Notice of Allowance issued for U.S. Appl. No. 12/787,828, dated Nov. 12, 2010.

(Continued)

*Primary Examiner* — Boris Chervinsky
(74) *Attorney, Agent, or Firm* — Dennis Jung, Esq.; Kevin P. Radigan, Esq.; Heslin Rothenberg Farley & Mesiti P.C.

(57) ABSTRACT

Dehumidifying and re-humidifying cooling apparatus and method are provided for an electronics rack. The apparatus includes a dehumidifying air-to-liquid heat exchanger disposed at an air inlet side of the rack and a re-humidifying structure disposed at an air outlet side of the rack. The dehumidifying air-to-liquid heat exchanger is in fluid communication with a coolant loop for passing chilled coolant through the heat exchanger, and the dehumidifying heat exchanger dehumidifies ingressing air to the electronics rack to reduce a dew point of air flowing through the rack. A condensate collector disposed at the air inlet side collects liquid condensate from the dehumidifying of ingressing air, and a condensate delivery mechanism delivers the condensate to the re-humidifying structure to humidify air egressing from the electronics rack.

25 Claims, 24 Drawing Sheets

U.S. PATENT DOCUMENTS

| | | | |
|---|---|---|---|
| 6,490,874 B2 * | 12/2002 | Chu et al. ............................ | 62/93 |
| 6,535,382 B2 | 3/2003 | Bishop et al. | |
| 6,621,707 B2 * | 9/2003 | Ishimine et al. .............. | 361/721 |
| 6,628,520 B2 | 9/2003 | Patel et al. | |
| 6,760,221 B2 | 7/2004 | Goth et al. | |
| 6,775,137 B2 | 8/2004 | Chu et al. | |
| 6,778,394 B2 | 8/2004 | Oikawa et al. | |
| 6,819,563 B1 | 11/2004 | Chu et al. | |
| 6,973,801 B1 | 12/2005 | Campbell et al. | |
| 7,000,467 B2 | 2/2006 | Chu et al. | |
| 7,002,799 B2 | 2/2006 | Malone et al. | |
| 7,086,247 B2 | 8/2006 | Campbell et al. | |
| 7,104,081 B2 | 9/2006 | Chu et al. | |
| 7,277,282 B2 | 10/2007 | Tate | |
| 7,353,861 B2 | 4/2008 | Chu et al. | |
| 7,355,852 B2 | 4/2008 | Pfahnl | |
| 7,385,810 B2 | 6/2008 | Chu et al. | |
| 7,450,385 B1 | 11/2008 | Campbell et al. | |
| 7,542,290 B2 | 6/2009 | Tracy et al. | |
| 7,848,106 B2 * | 12/2010 | Merrow ......................... | 361/696 |
| 7,895,855 B2 * | 3/2011 | Gooch ......................... | 62/259.2 |
| 7,905,096 B1 * | 3/2011 | Campbell et al. ................. | 62/93 |
| 8,004,839 B2 | 8/2011 | Sato et al. | |
| 8,033,122 B2 * | 10/2011 | Bean, Jr. ............................ | 62/93 |
| 2004/0177948 A1 | 9/2004 | Cho et al. | |
| 2005/0231913 A1 | 10/2005 | Malone et al. | |
| 2008/0232069 A1 | 9/2008 | Chu et al. | |
| 2008/0276656 A1 | 11/2008 | Kitamura et al. | |
| 2009/0080173 A1 | 3/2009 | Porter et al. | |

OTHER PUBLICATIONS

"RackCooler—A Cool Solution for X-Treme Density Rack Enclosure Systems", Liebert Corporation, Product Brochure, 8 pgs. (2001).

Teague, Paul E., "One Cool Machine", Design News for Mechanical and Design Engineers, Internet Article, 6 pgs. (Feb. 7, 2005).

Office Action for U.S. Appl. No. 12/787,790 (U.S. Patent Publication No. 2011/0292600 A1), dated Dec. 23, 2011.

Office Action for U.S. Appl. No. 12/787,790 (U.S. Patent Publication No. 2011/0292600 A1), dated Dec. 23, 2011.

* cited by examiner

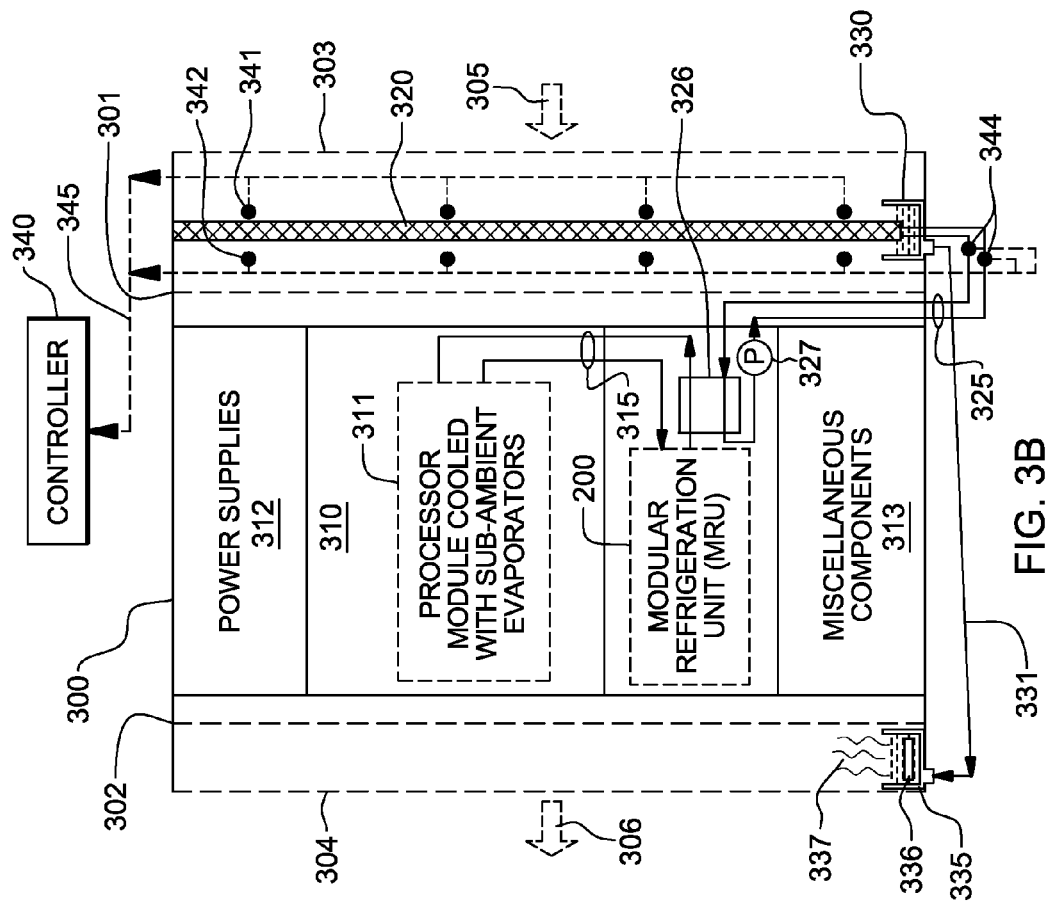
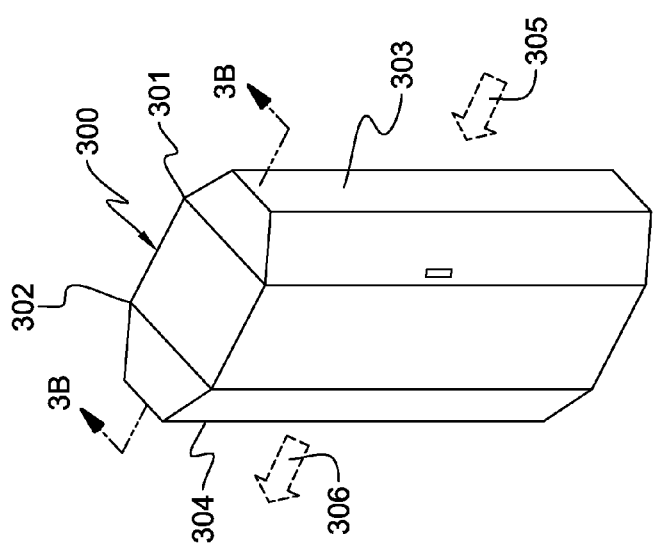
FIG. 3B
FIG. 3A

DEHUMIDIFYING AND RE-HUMIDIFYING APPARATUS AND METHOD FOR AN ELECTRONICS RACK

BACKGROUND

The present invention relates in general to cooling of an electronics rack(s) of a data center, including rack-mounted assemblages of individual electronics units, such as rack-mounted computer server units.

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the data center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow through the use of a more powerful air moving device or by increasing the rotational speed (i.e., RPMs) of an existing air moving device. However, this approach is becoming problematic at the electronic component and at the rack level in the context of a computer installation (e.g., a data center).

For example, the sensible heat load carried by the air exiting the rack is stressing the ability of the room air-conditioning to effectively handle the load. This is especially true for large installations with "server farms" or large banks of computer racks close together. In such installations, liquid cooling (e.g., refrigerant or water-cooling) is an attractive technology to manage the higher heat fluxes of selected high heat flux electronic components within the electronics rack. The liquid coolant absorbs the heat dissipated by the high heat flux components/modules in an efficient manner, with the heat typically being transferred from the liquid coolant to an outside environment, whether air or other liquid coolant.

BRIEF SUMMARY

In one aspect, an apparatus is provided herein for facilitating cooling of an electronics rack. The apparatus includes a dehumidifying air-to-liquid heat exchanger, a condensate collector, and a condensate evaporation system. The dehumidifying air-to-liquid heat exchanger is configured to reside at an air inlet side of the electronics rack, wherein the electronics rack includes the air inlet side and an air outlet side for respectively enabling ingress and egress of air through the electronics rack. The dehumidifying air-to-liquid heat exchanger is positioned (when mounted to the electronics rack) for ingressing air to pass thereacross before passing through the electronics rack. The dehumidifying air-to-liquid heat exchanger is in fluid communication with a coolant loop for passing chilled coolant therethrough, and the dehumidifying air-to-liquid heat exchanger with the chilled coolant passing therethrough dehumidifies air ingressing into the electronics rack to lower a dew point temperature of the air flowing through the electronics rack. The condensate collector is disposed at the air inlet side of the electronics rack and collects liquid condensate from the dehumidifying air-to-liquid heat exchanger's dehumidifying of ingressing air to the electronics rack. The condensate evaporation system humidifies air egressing from the electronics rack. The condensate evaporation system is coupled in fluid communication with the condensate collector at the air inlet side of the electronics rack and evaporates liquid condensate received from the condensate collector. The condensate evaporation system includes a re-humidifying structure configured to reside at the air outlet side of the electronics rack so that air egressing from the air outlet side of the electronics rack passes across the re-humidifying structure, and a condensate delivery mechanism which delivers liquid condensate from the condensate collector disposed at the air inlet side of the electronics rack to the re-humidifying structure disposed at the air outlet side of the electronics rack, wherein the re-humidifying structure re-humidifies air egressing from the air outlet side of the electronics rack employing liquid condensate collected by the condensate collector.

In another aspect, an apparatus for facilitating cooling of an electronics rack is provided. The apparatus includes a dehumidifying air-to-liquid heat exchanger, a condensate collector, and a condensate evaporation system. The dehumidifying air-to-liquid heat exchanger is configured to reside at an air inlet side of the electronics rack, wherein the electronics rack includes the air inlet side and an air outlet side for respectively enabling ingress and egress of air through the electronics rack. The dehumidifying air-to-liquid heat exchanger is positioned (when mounted to the electronics rack) for ingressing air to pass thereacross before passing through the electronics rack. The dehumidifying air-to-liquid heat exchanger is in fluid communication with a coolant loop for passing chilled coolant therethrough, and the dehumidifying air-to-liquid heat exchanger with the chilled coolant passing therethrough dehumidifies air ingressing into the electronics rack to lower a dew point temperature of the air flowing through the electronics rack. The condensate collector is disposed at the air inlet side of the electronics rack and collects liquid condensate from the dehumidifying air-to-liquid heat exchanger's dehumidifying of ingressing air to the electronics rack. The condensate evaporation system is coupled in fluid communication with the condensate collector at the air inlet side of the electronics rack and evaporates liquid condensate received therefrom. The condensate evaporation system includes a humidifying structure for evaporating liquid condensate, and a condensate delivery mechanism delivering liquid condensate from the condensate collector disposed at the air inlet side of the electronics rack to the humidifying structure for evaporating liquid condensate.

In yet another aspect, a cooled electronics system is provided which includes an electronics rack and a dehumidifying and re-humidifying cooling apparatus for the electronics rack. The electronics rack includes an air inlet side and an air outlet side for respectively enabling ingress and egress of air, at least one electronic component requiring cooling, and at least one air-moving device. The at least one air-moving device causes air to flow from the air inlet side of the electronics rack through the electronics rack, to the air outlet side thereof. The dehumidifying and re-humidifying cooling apparatus includes: a dehumidifying air-to-liquid heat exchanger, a condensate collector, and condensate evaporation system. The dehumidifying air-to-liquid heat exchanger is disposed at the air inlet side of the electronics rack, and is positioned for ingressing air to pass thereacross before passing through the electronics rack. The dehumidifying air-to-liquid heat exchanger is in fluid communication with a coolant loop for passing chilled coolant therethrough, wherein the dehumidifying air-to-liquid heat exchanger with chilled coolant passing therethrough dehumidifies ingressing air to the electronics rack to lower a dew point temperature of air flowing through the electronics rack. The condensate collector is disposed at the air inlet side of the electronics rack and collects liquid condensate from the dehumidifying air-to-liquid heat exchanger's dehumidifying of ingressing air to the electronics rack. The condensate evaporation system humidifies air egressing from the electronics rack, and is coupled in fluid communication with the condensate collector at the air inlet side of the electronics rack and evaporates liquid condensate received therefrom. The condensate evaporation system includes a re-humidifying structure disposed at the air outlet side of the electronics rack so that air egressing from the air outlet side of the electronics rack passes through the re-humidifying structure, and a condensate delivery mechanism delivering liquid condensate from the condensate collector disposed at the air inlet side of the electronics rack to the re-humidifying structure disposed at the air outlet side of the electronics rack. The re-humidifying structure re-humidifies air egressing from the air outlet side of the electronics rack using liquid condensate collected at the condensate collector.

In a further aspect, a method of facilitating cooling of an electronics rack is provided. The method includes: disposing a dehumidifying air-to-liquid heat exchanger at an air inlet side of the electronics rack, wherein the electronics rack comprises the air inlet side and an air outlet side, the air inlet side and the air outlet side respectively enabling ingress and egress of air through the electronics rack, and the dehumidifying air-to-liquid heat exchanger being positioned for ingressing air to pass thereacross before passing through the electronics rack, the dehumidifying air-to-liquid heat exchanger being in fluid communication with a coolant loop for passing chilled coolant therethrough, and the dehumidifying air-to-liquid heat exchanger with chilled coolant passing therethrough dehumidifying ingressing air to the electronics rack to lower a dew point temperature of air flowing through the electronics rack; disposing a re-humidifying structure at the air outlet side of the electronics rack so that air egressing from the air outlet side of the electronics rack passes through the re-humidifying structure; collecting liquid condensate from the dehumidifying air-to-liquid heat exchanger's dehumidifying of ingressing air to the electronics rack; delivering the liquid condensate from the air inlet side of the electronics rack to the re-humidifying structure at the air outlet side thereof; and evaporating at the air outlet side of the electronics rack the liquid condensate delivered to the re-humidifying structure to humidify air egressing from the electronics rack.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 3A depicts one embodiment of an electronics rack to employ a dehumidifying and re-humidifying cooling apparatus, in accordance with an aspect of the present invention;

FIG. 3B is a cross-sectional elevational view of the electronics rack of FIG. 3A, taken along line 3B-3B, and illustrating one embodiment of a dehumidifying and re-humidifying cooling apparatus, in accordance with an aspect of the present invention;

DETAILED DESCRIPTION

Figure 1:
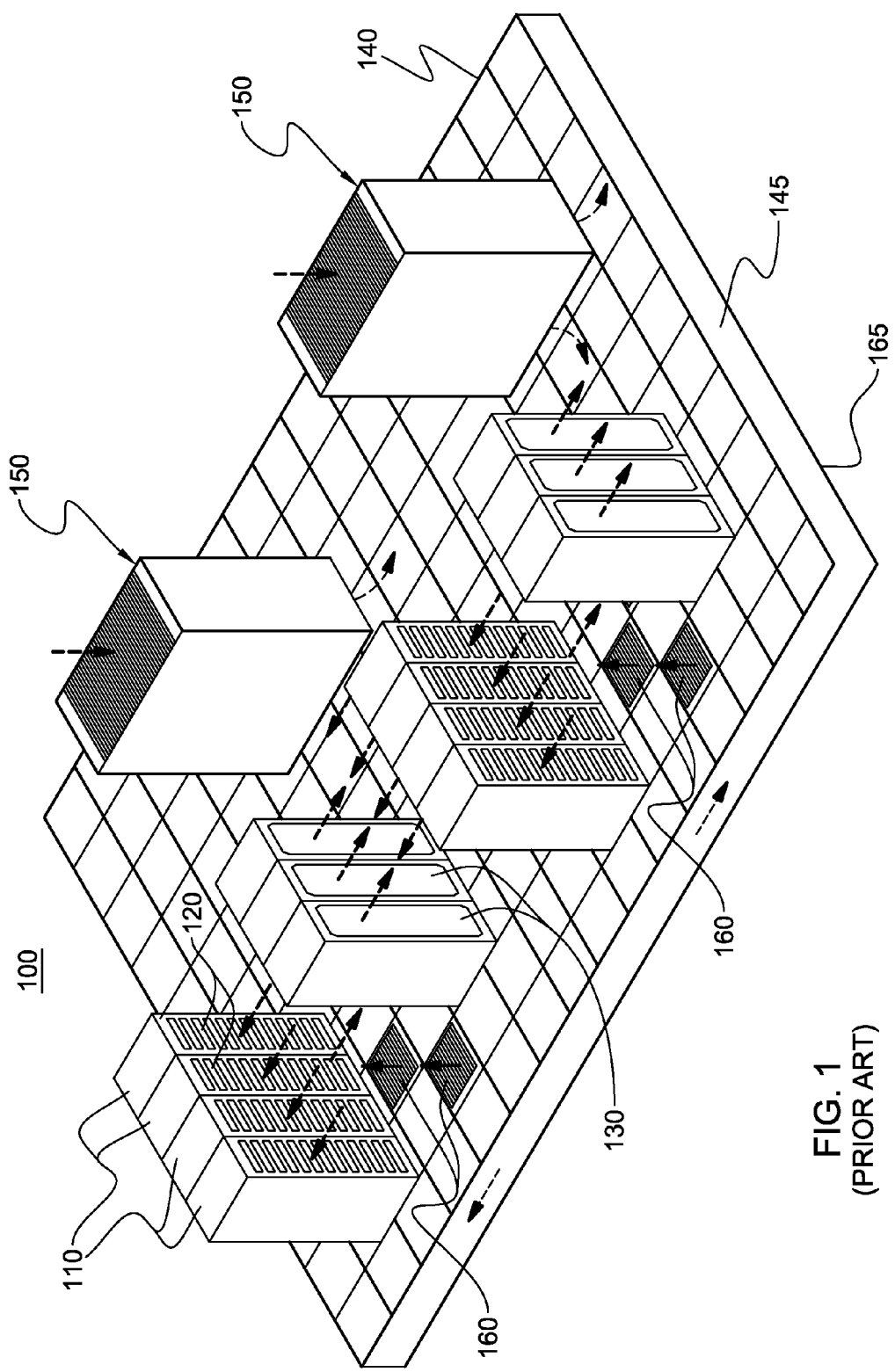
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with rack-mounted electronics drawers of a multi-drawer rack unit and blades of a blade center system being two examples of subsystems of an electronics rack to be cooled.

"Electronic component" refers to any heat generating electronic component or module of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling or condensing fins. Size, configuration and construction of the air-to-liquid heat exchanger can vary without departing from the scope of the invention disclosed herein. A "liquid-to-liquid heat exchanger" may comprise, for example, two or more separate coolant flow paths, formed of thermally conductive tubings (such as copper or other tubing) in thermal communication with each other. Size, configuration and construction of the liquid-to-liquid heat exchanger can vary without departing from the scope of the invention disclosed herein.

Unless otherwise specified, the term "cold plate" or "liquid-cooled cold plate" refers to any conventional thermally conductive structure having one or more channels or passageways formed therein for flowing of liquid coolant therethrough. "Refrigerant evaporator" refers to the heat-absorbing mechanism or structure within a refrigeration loop. The refrigerant evaporator is alternatively referred to as a "sub-ambient evaporator" when temperature of the refrigerant passing through the refrigerant evaporator is below the dew point temperature of ambient air entering the electronics rack. Within the refrigerant evaporator, heat is absorbed by evaporating the refrigerant of the refrigerant loop. "Condensate evaporator" refers to any condensate evaporation structure, which in one embodiment, may comprise one or more adjustable heaters for actively controlling an amount of evaporation, and thus an amount of humidification of egressing air. In addition, airflow through the electronics rack described herein comprises, in one example, ambient room air, which may be cooled via one or more computer room air-conditioning units, such as described below in connection with FIG. 1. This airflow through the electronics rack is an open path flow, drawing in room air into the electronics rack and expelling exhaust air from the electronics rack back into the room. Further, "data center" refers to a computer installation containing one or more electronics racks to be cooled. As a specific example, a data center may include one or more rows of rack-mounted computing units, such as server units.

One example of facility coolant disclosed below is water, and examples of coolant employed in the air-to-liquid heat exchanger of the dehumidifying and re-humidifying cooling apparatus disclosed are water or a refrigerant. However, the concepts disclosed herein are readily adapted to use with other types of coolant. For example, one or more of the coolants may comprise a dielectric liquid, a fluorocarbon liquid, a Fluorinert™ liquid, a liquid metal, a brine, or other similar coolant, while still maintaining the advantages and unique features of the present invention. Thus, although the facility coolant is described herein below as water, and the coolant through the heat exchangers is described below as either water or a refrigerant, these are only examples.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

In high performance server systems, it has become desirable to supplement air-cooling of selected high heat flux electronic components, such as the processor modules, within the electronics rack. For example, the System z® server marketed by International Business Machines Corporation, of Armonk, N.Y., employs a vapor-compression refrigeration cooling system to facilitate cooling of the processor modules within the electronics rack. This refrigeration system employs R134a refrigerant as the coolant, which is supplied to a refrigerant evaporator coupled to one or more processor modules to be cooled. The refrigerant is provided by a modular refrigeration unit (MRU), which supplies the refrigerant at an appropriate temperature.

Figure 2B:
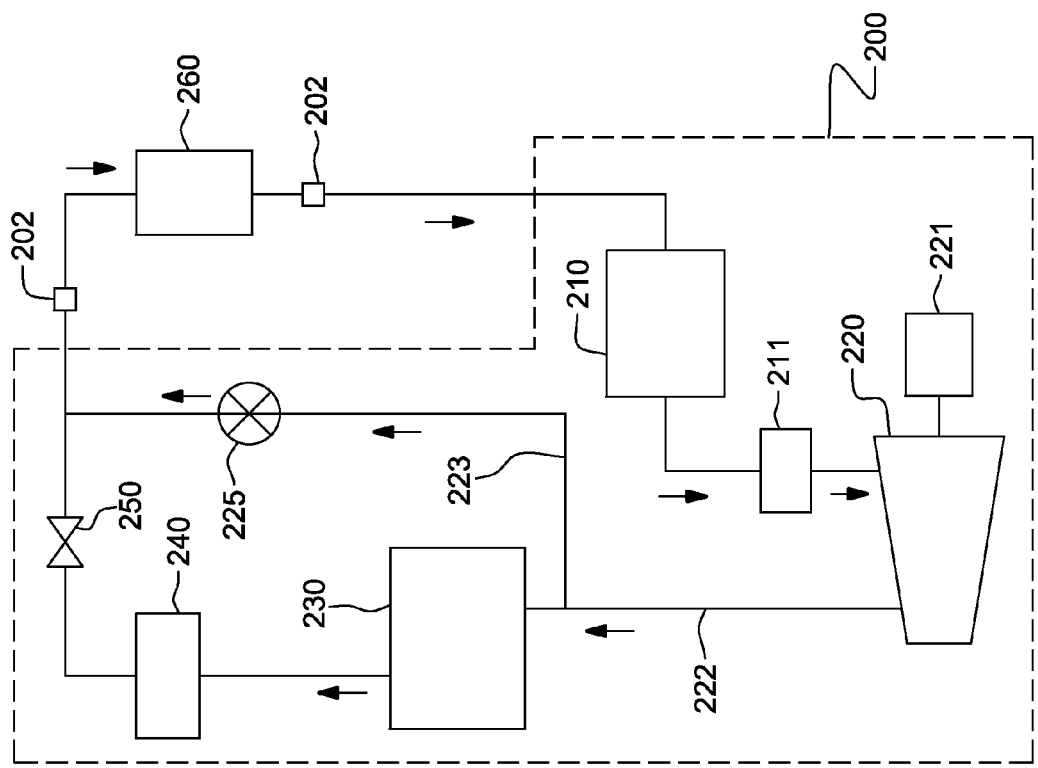
FIG. 2B is a schematic of one embodiment of a refrigerant loop for cooling an evaporator (or cold plate) coupled to a high heat flux electronic component (e.g., module) to be cooled, in accordance with an aspect of the present invention.
Figure 2A:
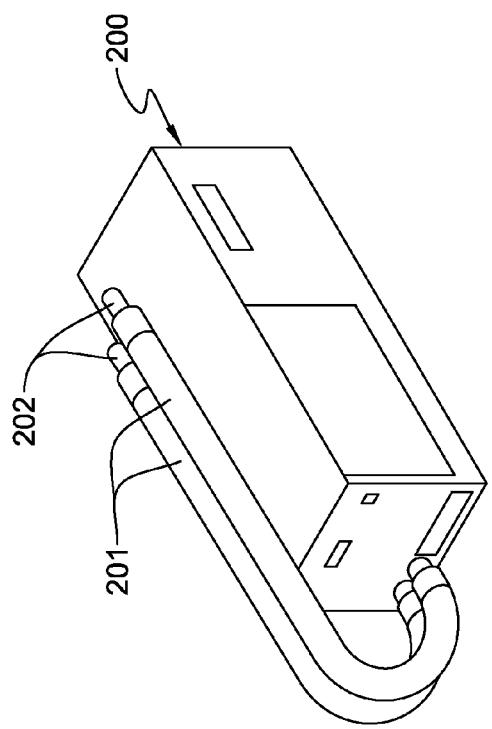
FIG. 2A is an isometric view of one embodiment of a modular refrigeration unit (MRU) and its quick disconnect connectors for attachment to a cold plate and/or evaporator disposed within an electronics rack to cool one or more electronic components (e.g., modules) thereof, in accordance with an aspect of the present invention.

FIG. 2A depicts one embodiment of a modular refrigeration unit 200, which may be employed within an electronic rack, in accordance with an aspect of the present invention. As illustrated, modular refrigeration unit 200 includes refrigerant supply and exhaust hoses 201 for coupling to a refrigerant evaporator or cold plate (not shown), as well as quick disconnect couplings 202, which respectively connect to corresponding quick disconnect couplings on either side of the refrigerant evaporator, that is coupled to the electronic component(s) or module(s) (e.g., server module(s)) to be cooled. Further details of a modular refrigeration unit such as depicted in FIG. 2A are provided in commonly assigned U.S. Pat. No. 5,970,731.

FIG. 2B is a schematic of one embodiment of modular refrigeration unit 200 of FIG. 2A, coupled to a refrigerant evaporator (not shown) for cooling, for example, an electronic component within an electronic subsystem of an electronics rack. The electronic component may comprise, for example, a multichip module, a processor module, or any other high heat flux electronic component (not shown) within the electronics rack. As illustrated in FIG. 2B, a refrigerant evaporator 260 is shown that is coupled to the electronic component (not shown) to be cooled and is connected to modular refrigeration unit 200 via respective quick disconnect couplings 202. Within modular refrigeration unit 200, a motor 221 drives a compressor 220, which is connected to a condenser 230 by means of a supply line 222. Likewise, condenser 230 is connected to evaporator 260 by means of a supply line which passes through a filter/dryer 240, which functions to trap particulate matter present in the refrigerant stream and also to remove any water which may have become entrained in the refrigerant flow. Subsequent to filter/dryer 240, refrigerant flow passes through an expansion device 250. Expansion device 250 may be an expansion valve. However, it may also comprise a capillary tube or thermostatic valve. Thus, expanded and cooled refrigerant is supplied to evaporator 260. Subsequent to the refrigerant picking up heat from the electronic component coupled to evaporator 260, the refrigerant is returned via an accumulator 210 which operates to prevent liquid from entering compressor 220. Accumulator 210 is also aided in this function by the inclusion of a smaller capacity accumulator 211, which is included to provide an extra degree of protection against the entry of liquid-phase refrigerant into compressor 220. Subsequent to accumulator 210, vapor-phase refrigerant is returned to compressor 220, where the cycle repeats. In addition, the modular refrigeration unit is provided with a hot gas bypass valve 225 in a bypass line 223 selectively passing hot refrigerant gas from compressor 220 directly to evaporator 260. The hot gas bypass valve is controllable in response to the temperature of evaporator 260, which is provided by a module temperature sensor (not shown), such as a thermistor device affixed to the evaporator/cold plate in any convenient location. In one embodiment, the hot gas bypass valve is electronically controlled to shunt hot gas directly to the evaporator when temperature is already sufficiently low. In particular, under low temperature conditions, motor 221 runs at a lower speed in response to the reduced thermal load. At these lower speeds and loads, there is a risk of motor 221 stalling. Upon detection of such a condition, the hot gas bypass valve is opened in response to a signal supplied to it from a controller of the modular refrigeration unit.

In certain implementations, customer data centers may have ambient air humidity levels that are in violation of standard specifications for IT equipment, yielding room dew point temperature values that are sufficiently high to risk water condensation on surfaces within the electronics rack (such as refrigeration-cooled surfaces within the electronics rack) that are cooler than the dew point. In such cases, while coolant-carrying tubes transporting refrigerant (which may be at a sub-ambient temperature) may be insulated, one or more surfaces of the refrigerant evaporator (or the electronic component being cooled thereby) may possess surface temperatures that are below the dew point of the humid air passing through the server rack. If this condition persists for a sufficient length of time, there is a possibility of moisture from the air stream passing through the electronics rack condensing on the (sub-ambient) cooled surfaces, leading to the collection of water inside of the rack. This collected water could then fall on exposed electronic components due to gravity, or may be carried along due to the momentum of the airflow near the water collection surface(s). If the condensed water makes contact with exposed electronic devices, it could result in corrosion of electronic components, as well as in the short circuiting of electrical conductors.

Thus, disclosed herein (in one aspect) is a dehumidifying and re-humidifying cooling apparatus comprising a heat exchanger assembly for, for example, a front door of an electronics rack hingedly mounted to an air inlet side of the rack, wherein ambient room air passes through the electronics rack from an air inlet side to an air outlet side thereof. The heat exchange assembly includes an air-to-liquid heat exchanger positioned for ingressing air to pass thereacross before passing through the rack, and the heat exchanger is in fluid communication with a coolant loop for passing chilled coolant therethrough. The air-to-liquid heat exchanger with the chilled coolant passing therethrough dehumidifies ingressing air to the rack to lower a dew point temperature of the air flowing through the rack. A condensate collector is disposed at the air inlet side of the rack, below the air-to-liquid heat exchanger, for collecting liquid condensate from the air-to-liquid heat exchanger's dehumidifying of ingressing air to the rack. Further, a condensate evaporator is disposed at the air outlet side of the rack which humidifies air egressing from the electronics rack. The condensate evaporator is coupled in fluid communication with the condensate collector at the air inlet side of the rack, and evaporates liquid condensate received from the condensate collector. By dehumidifying the air entering the electronics rack, the dehumidifying and re-humidifying cooling apparatus disclosed herein mitigates the risk of water condensate forming in the proximity of exposed electronic components by, for example, cooling one or more electronic components within the rack to a temperature below the dew point temperature of the ambient air of the data center. The dehumidifying and re-humidifying cooling apparatus disclosed herein may also be used with water-cooled electronics racks, which when exposed to data center environments with sufficiently high dew point temperatures, can run the risk of water condensation as well. By way of example, reference in this regard commonly assigned U.S. Pat. No. 7,450,385, which describes in detail an embodiment of a liquid-based cooling apparatus for an electronics rack, wherein the liquid may comprise water. Such a liquid-based cooling apparatus may contain several metallic water-carrying structures (tubes, cold plates, etc.) within the electronic subsystems, which potentially could be sites for water condensation should (for example) the humidity levels of ambient air being drawn through the electronics rack be in violation of predefined specifications for the rack.

FIGS. 3A & 3B depict one embodiment of an electronics rack 300 comprising an air inlet side 301 and an air outlet side 302, which respectively enable open flow ingress 305 and egress 306 of ambient room air through the electronics rack to facilitate cooling of electronic components within the rack. Electronics rack 300 includes a perforated front door 303 coupled to the air inlet side 301 of the electronics rack, and a perforated rear door 304 coupled to the air outlet side 302 of electronics rack 300. In one implementation, cool, humid ambient air 305 ingresses through perforated front door 303, and heated, humid exhaust air 306 egresses through perforated rear door 304.

FIG. 3B is a cross-sectional elevational view of electronics rack 300 of FIG. 3A, taken along line 3B-3B. By way of example, electronics rack 300 may comprise a System z® electronics rack offered by International Business Machines Corporation, of Armonk, N.Y. Electronics rack 300 is shown to include one or more electronic subsystems 310, including processor modules to be cooled by sub-ambient evaporators 311. A modular refrigeration unit 200 is also provided, as well as power supplies 312 and miscellaneous components 313, such as input/output communication components 313. Perforated front door 303 is shown coupled to air inlet side 301 of electronics rack 300, and perforated rear door 304 is coupled to air outlet side 302 of electronics rack 300, wherein cool, humid ambient air 305 ingresses through perforated front door 303, passing across the electronic components within the electronics rack, and egresses as hot exhaust air 306. As illustrated, modular refrigeration unit 200 is in fluid communication with the sub-ambient or refrigerant evaporators coupled to the processor modules to be cooled 311, via a refrigerant loop 315.

In this example, it is assumed that the ambient air entering the electronics rack is humid, and is to be dehumidified, to facilitate the sub-ambient cooling of the high heat flux electronic components coupled to the evaporators. The dehumidifying and re-humidifying cooling apparatus disclosed herein includes, in part, an air-to-liquid heat exchanger 320 disposed at air inlet side 301 of electronics rack 300, for example, within perforated front door 303, as well as a condensate collector 330 disposed to collect liquid condensate from the air-to-liquid heat exchanger's dehumidifying of the ingressing ambient air, and a condensate evaporator 335 disposed at air outlet side 302 of electronics rack 300, for example, in perforated rear door 304, for humidifying exhaust air egressing from the electronics rack. Condensate evaporator 335 is shown coupled in fluid communication with condensate collector 330 via a line 331 configured to feed (e.g., via gravity) liquid condensate from condensate collector 330 to condensate evaporator 335. Liquid condensate delivered to condensate evaporator 335 may be heated, for example, via one or more adjustable water heaters 336 to evaporate the liquid condensate 337 into the exhaust air egressing from the air outlet side 302 of electronics rack 300.

In this embodiment, air-to-liquid heat exchanger 320 may comprise an air-to-water heat exchanger, wherein water is fed through the heat exchanger via a coolant loop 325. The water within coolant loop 325 is cooled via a liquid-to-liquid heat exchanger 326 in fluid communication with both refrigerant loop 315 and coolant loop 325. That is, refrigerant exiting modular refrigeration unit 200 passes through liquid-to-liquid heat exchanger 326 and cools the coolant within coolant loop 325 before passing through the sub-ambient evaporators 311. Coolant (e.g., water) is pumped 327 through coolant loop 325, including through air-to-liquid heat exchanger 320.

To facilitate operation of the dehumidifying and re-humidifying cooling apparatus disclosed herein, a controller 340 is provided coupled via data cables 345 to a plurality of rack inlet temperature and relative humidity sensors 341, as well as to a plurality of server inlet temperature and relative humidity sensors 342, and system coolant temperature sensors 344 disposed in the coolant supply line and coolant return line of coolant loop 325 coupled to air-to-liquid heat exchanger 320. In addition, controller 340 is coupled, in one embodiment, to pump 327 for automatically controlling the ON/OFF state of pump 327, as well as the speed of the pump, and to heater(s) 336 disposed within condensate evaporator 335 for automatically controlling the rate of evaporation of liquid condensate from the condensate evaporator.

Figure 3C:
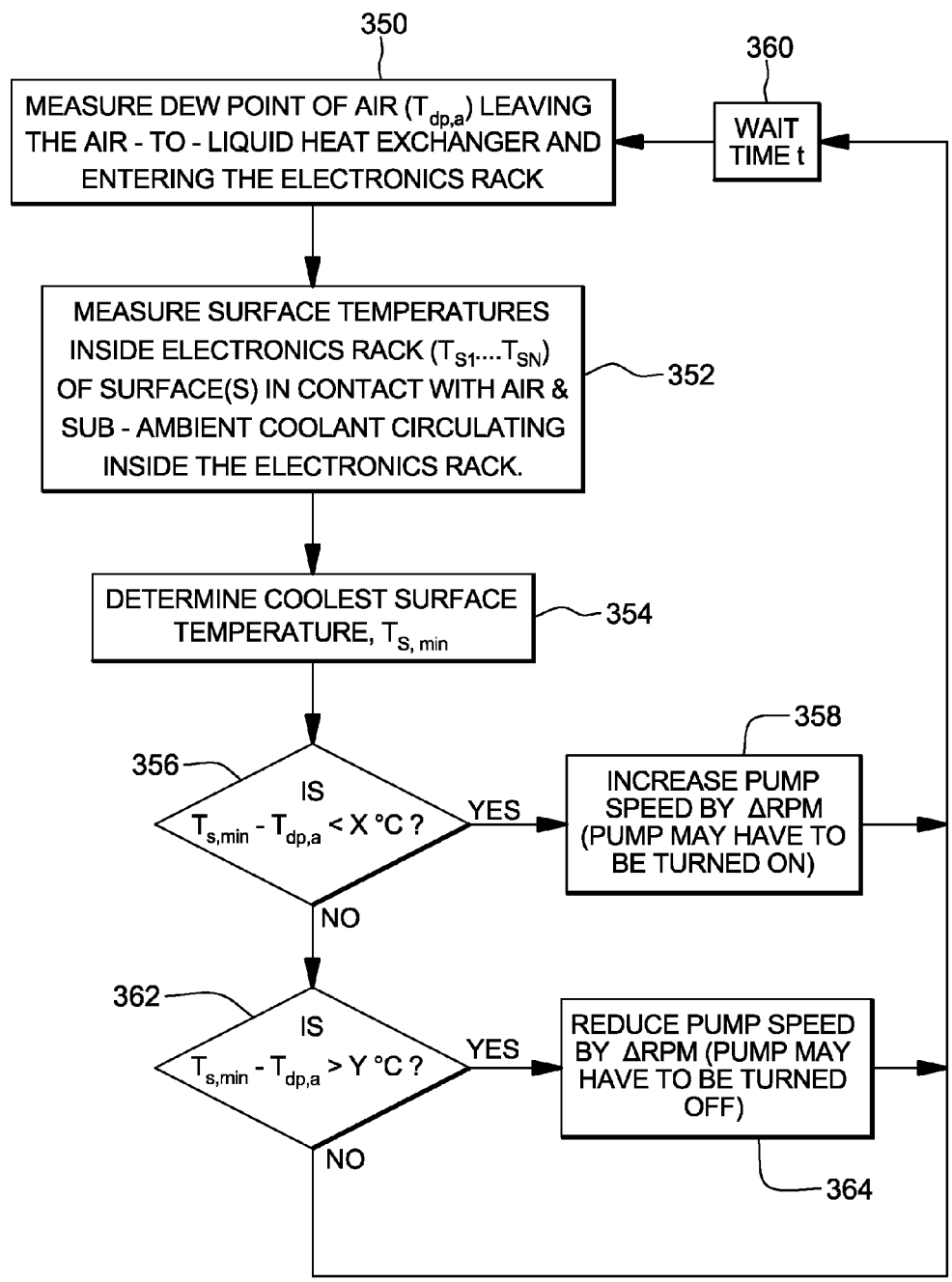
FIG. 3C depicts one embodiment of a control process for controlling the dehumidifying of ingressing air to the electronics rack, in accordance with an aspect of the present invention.

FIG. 3C illustrates one example of processing implemented by controller 340 for controlling dehumidifying of the ingressing ambient air passing across the air-to-liquid heat exchanger 320 of the dehumidifying and re-humidifying cooling apparatus of FIGS. 3A & 3B. In this example, coolant flowing through the air-to-liquid heat exchanger is assumed to be water, and liquid-to-liquid heat exchanger 326 (FIG. 3B) is a water-to-refrigerant heat exchanger. Control of the water flow rate through coolant loop 325 (FIG. 3B) can result in a higher or lower water temperature exiting the water-to-refrigerant heat exchanger and entering the air-to-liquid heat exchanger. A higher water flow rate resulting from a higher pump motor speed yields a lower water temperature exiting the liquid-to-liquid heat exchanger, and vice versa. Alternatively, a bypass valve (not shown) could be used in automatically controlling the coolant temperature entering the air-to-liquid heat exchanger, whether the coolant is water, a refrigerant, or other coolant. There can still be other approaches to controlling the coolant temperature entering the air-to-liquid heat exchanger. For example, the flow rate and temperature of refrigerant coolant on the cold side of the liquid-to-liquid heat exchanger could be manipulated.

In the process of FIG. 3C, the coolant temperature control is based on an extent of dehumidification deemed necessary based on a sensed dew point temperature of the ambient air entering the electronics rack (e.g., the servers within the rack), that is, the sensed dew point temperature of dehumidified air exiting the air-to-liquid heat exchanger ($T_{dp,a}$) as well as a coolest measured surface temperature ($T_{s1}, T_{s2} \ldots T_{sN}$) of various cool surfaces monitored within the rack that will contact air passing through the electronics rack. The location of the cool surface temperature sensors can be determined a priori, based on lab testing of the particular electronics rack implementation. The cool surface temperatures could be sensed at various parts of the rack's interior; for example, on the tubing or the hoses that distribute sub-ambient coolant, or on the cold plates or evaporators that cool the processor modules. The coolest surface is denoted as $T_{s,\,min}$ in FIG. 3C. Note that, in this discussion, dehumidifying of ambient air passing across the air-to-liquid heat exchanger may depend on the sensed dew point temperature of the ambient air passing across the air-to-liquid heat exchanger. For example, if the air dew point is sufficiently low, e.g., the humidity of the ambient air is within specification for the electronics rack, then no dehumidification may be needed. Thus, the dehumidifying and humidifying cooling apparatus disclosed herein may be selectively activated and deactivated by the controller as needed, dependent on ambient air conditions.

Referring to the flowchart of FIG. 3C, the controller 340 (FIG. 3B) determines the dew point of the air leaving the dehumidifying air-to-liquid heat exchanger 320 (FIG. 3B) and entering the air inlet side of the electronics rack 350, as well as determines the monitored surface temperatures inside the electronics rack ($T_{s1} \ldots T_{sN}$) of surfaces in contact with air and sub-ambient coolant circulating inside the electronics rack 352. The controller then determines the coolest surface temperature $T_{s,\,min}$ 354. After these temperatures ($T_{dp,a}$ and $T_{s,\,min}$) are sensed or determined, the difference in temperature between the coolest surface temperature $T_{s,\,min}$ and the dew point temperature $T_{dp,a}$ is determined and the controller compares this difference with a first predetermined threshold value X° C. 356. If the difference is lower than the first predefined threshold X° C., then it means that the dew point of the air entering the server is close to a value when condensation might begin to occur. In such a case, the pump flow rate is increased (or if the pump is OFF, the pump is switched ON) 358 so as to increase (or start) dehumidifying of the air passing across the dehumidifying air-to-liquid heat exchanger, thus yielding a lower value for $T_{dp,a}$. In the case where the difference between $T_{s,\,min}$ and $T_{dp,a}$ is very large, that is greater than a second threshold value Y° C. (where X<Y) 362, then the air is deemed to be unnecessarily dry, and the pump flow rate can be ramped down (or the pump switched OFF) 364 to reduce the extent of dehumidification, thus yielding a higher $T_{dp,a}$. After waiting a defined time interval t 360, the processing determines a new dew point temperature for the air leaving the dehumidifying air-to-liquid heat exchanger ($T_{dp,a}$) and new surface temperatures inside the electronics rack ($T_{s1} \ldots T_{sN}$) to identify a new coolest surface temperature $T_{s,\,min}$.

The preceding processing describes a method for controlling dehumidifying based on sensed air dew point temperature and sensed cool surface temperatures within the electronics rack. Alternative to this approach, the temperature of the cool surfaces could be reduced by a reduction in coolant temperature being applied within the electronics rack such that no condensation would occur within the rack, while still providing for greater cooling capability through the reduction of coolant temperature. In such a case, the dehumidifying air-to-liquid heat exchanger can be operated for maximum dehumidification in conjunction with a provision for coolest possible coolant being circulated through the liquid-cooled cold plates or evaporators within the electronics rack coupled to the one or more electronic components to be cooled. In cases (described below) where the coolant flowing through the dehumidifying air-to-liquid heat exchanger is in series flow with the coolant flowing through the liquid-cooled cold plates or evaporators, there is an intrinsic overall system attribute which would reduce the likelihood of condensation within the electronics rack. This is because any likely condensation that may occur based on coolant temperature and ambient dew point temperature would likely occur at the dehumidifying air-to-liquid heat exchanger, and not inside the electronics rack.

Figure 3D:
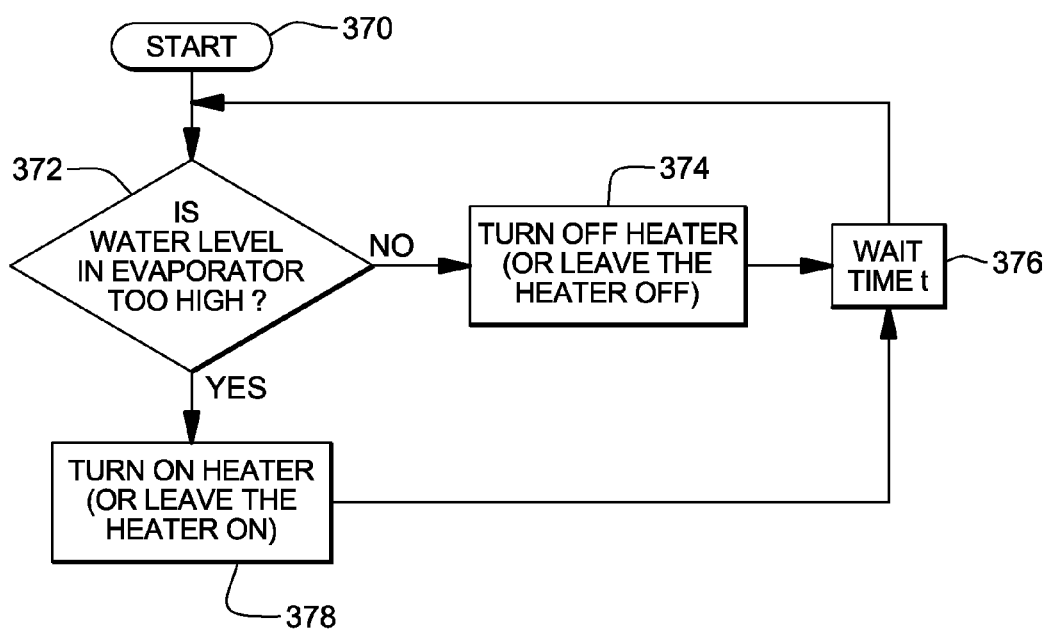
FIG. 3D depicts one embodiment of a control process for controlling evaporation of liquid condensate from the condensate evaporator at the air outlet side of the electronics rack, in accordance with an aspect of the present invention.

FIG. 3D depicts one implementation of a control process, which may also be implemented by controller 340 (FIG. 3B), for controlling operation of one or more heaters associated with the condensate evaporator for controlling a rate of liquid condensate evaporation into the exhaust air exiting the air outlet side of the electronics rack. The process starts 370 with the controller determining whether the water level within the condensate evaporator 335 (FIG. 3B) is too high 372. If "no", then the heater is turned OFF (or the heater is left OFF) 374, after which the controller waits a time interval t 376 before repeating the process. If the water level within the evaporator is determined to be too high, that is, is above a defined water level threshold, then the controller turns the heater ON, or if the heater is adjustable, increases the amount of heat being applied to the condensate evaporator to increase the rate of evaporation 378, after which the controller waits time interval t 376 before repeating the process.

In operation, the surfaces of air-to-liquid heat exchanger 320 (FIG. 3B) function as surfaces for condensation of excess moisture present in humid ingressing ambient air. Air-to-liquid heat exchanger 320 is configured and mounted so that ingressing ambient air into the electronics rack necessarily passes across the air-to-liquid heat exchanger before passing through the electronics rack. In this manner, the exposed surfaces of the air-to-liquid heat exchanger condense water from the humid ingressing ambient air, and the condensed water drains from the surfaces of the heat exchanger to the bottom of the heat exchanger into condensate collector 330. This condensate is then extracted from condensate collector using, in one embodiment, a gravity drain line which transports the liquid condensate to the condensate evaporator located at the air outlet side of the electronics rack. At the evaporator, the liquid condensate is evaporated so that the humid ambient air entering the rack is dehumidified at the air inlet side of the rack, and then the dehumidified exhaust air exiting the electronics rack is re-humidified using the liquid condensate collected at the air inlet side thereof. The heat absorbed by the chilled coolant (e.g., water) from the ingressing ambient air stream is both latent and sensible heat transfer, and (in the embodiment of FIG. 3B) this heat is rejected to the refrigerant flowing through the modular refrigeration unit via the liquid-to-liquid heat exchanger.

In the dehumidifying and re-humidifying cooling apparatus of FIG. 3B, quick disconnect couplings (not shown) can be employed in conjunction with hoses and barb fittings to plumb the air-to-liquid heat exchanger to the pump and liquid-to-liquid heat exchanger in a manner which facilitates easy assembly and disassembly, while still allowing the perforated front door to be opened and closed while the air-to-liquid heat exchanger is operational. The temperature and humidity sensors placed on both sides of the air-to-liquid heat exchanger provide real-time data to determine whether dehumidification is required, and if so, the temperature at which the chilled coolant should be provided, for example, by manipulating the pump speed. If dehumidification is not required, then the coolant loop's pump could be shut off. Similarly, heaters within the condensate evaporator could be powered to varying levels, depending on the water evaporation rate desired under the prevalent ambient conditions. For example, the condensate evaporator can be powered so that there is a constant condensate liquid in the evaporator so that whatever water is being condensed is also being subsequently evaporated. All surfaces exposed to the water condensate can be chemically treated to inhibit growth of biological or chemical matter.

Figure 4:
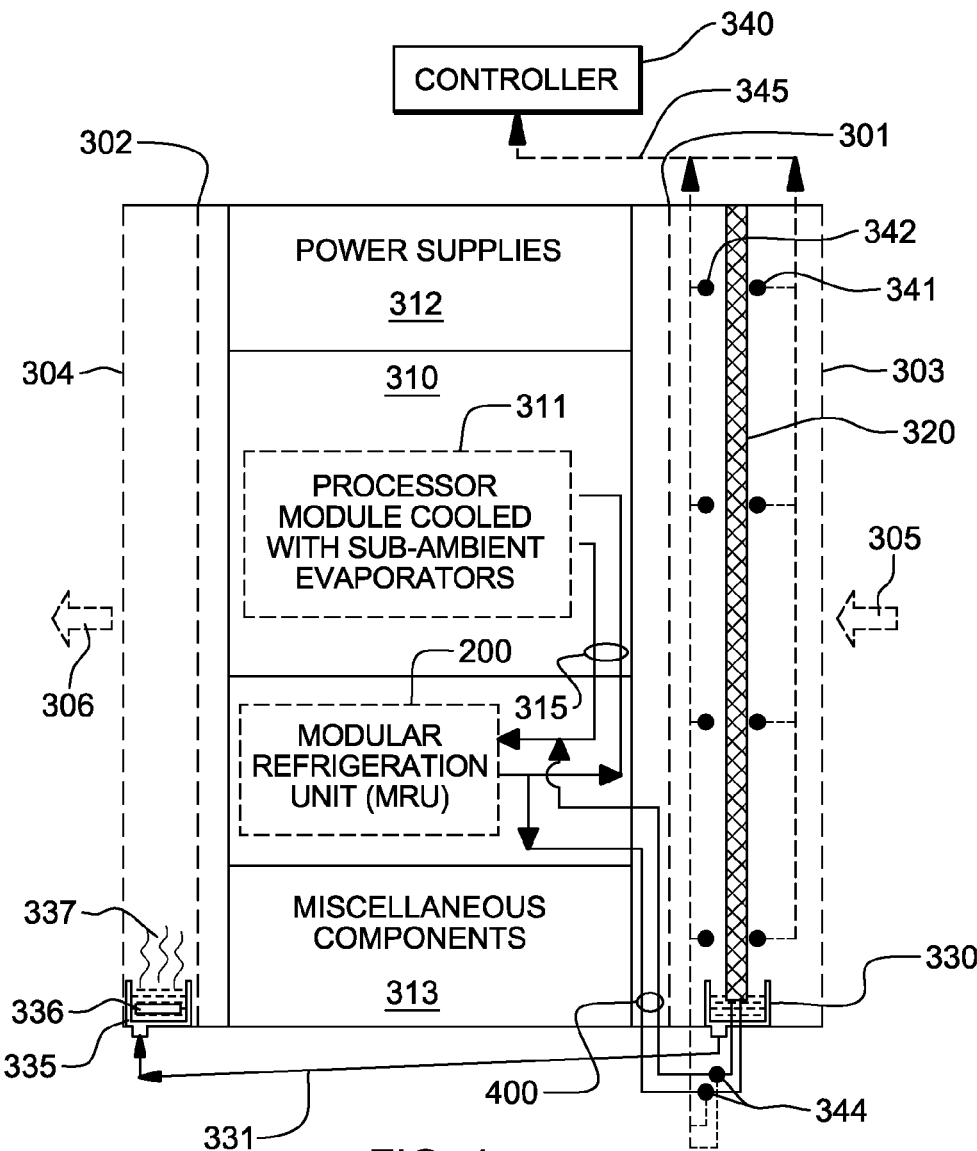
FIG. 4 is a cross-sectional elevational view of another embodiment of an electronics rack and a dehumidifying and re-humidifying cooling apparatus, in accordance with an aspect of the present invention.

FIG. 4 depicts an alternate embodiment of a dehumidifying and re-humidifying cooling apparatus, in accordance with an aspect of the present invention. This dehumidifying and re-humidifying cooling apparatus is identical to that described above in connection with FIG. 3B, with the exception that a coolant loop 400 is shown in fluid communication with the refrigerant loop 315 coupling modular refrigeration unit 200 to the sub-ambient evaporators coupled to the processor modules being liquid-cooled 311. Thus, in this embodiment, a portion of the chilled refrigerant from modular refrigeration unit 200 is routed directly through the air-to-liquid heat exchanger 320, and there is no external pump from the modular refrigeration unit required (or liquid-to-liquid heat exchanger required), with the modular refrigeration unit compressor and modular refrigeration unit heat exchanger being sized appropriately to allow for flow of refrigerant through the air-to-liquid heat exchanger 320. The remaining components of the dehumidifying and re-humidifying cooling apparatus depicted in FIG. 4 are similar to the corresponding labeled components described above in connection with FIG. 3B. In this implementation, liquid temperature sensors 344 are sensing temperature of the refrigerant flowing through coolant loop 400, rather than, for example, water, as in the case of the embodiment of FIG. 3B.

Figure 5:
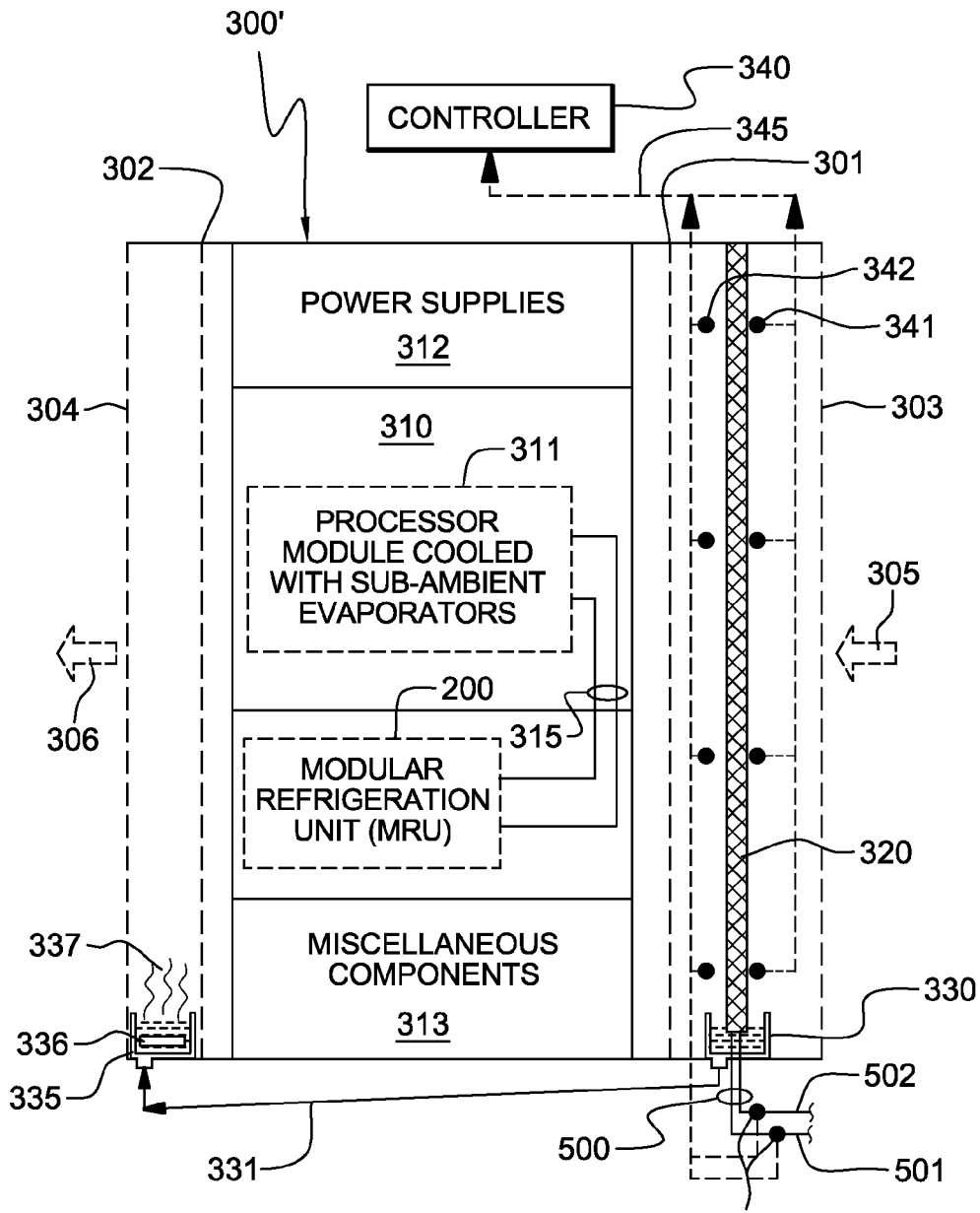
FIG. 5 is a cross-sectional elevational view of still another embodiment of an electronics rack and a dehumidifying and re-humidifying cooling apparatus, in accordance with an aspect of the present invention.
Figure 6:
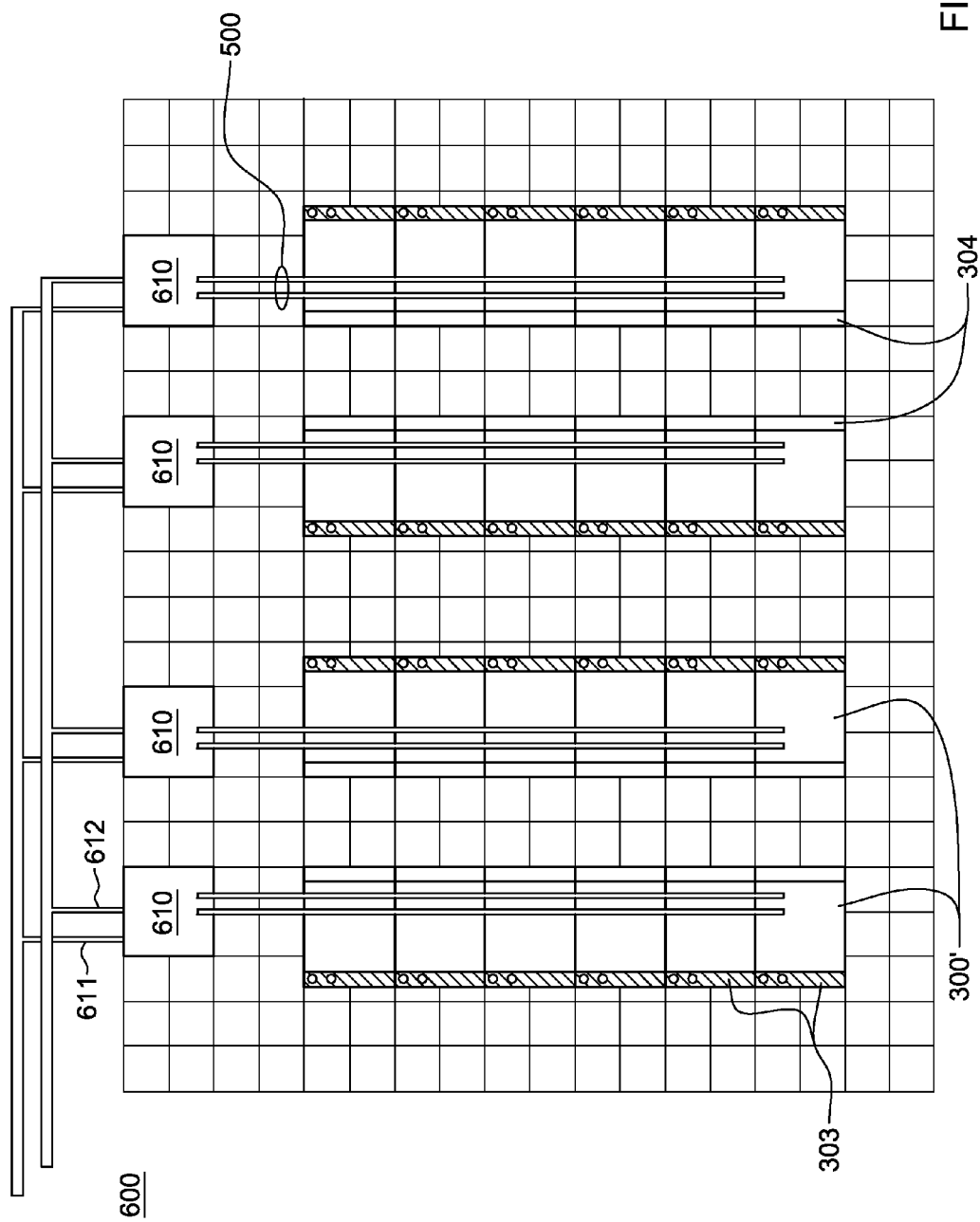
FIG. 6 is a top plan view of one embodiment of a data center comprising multiple coolant distribution units and a plurality of electronics racks with dehumidifying and re-humidifying cooling apparatuses such as depicted in FIG. 5, in accordance with an aspect of the present invention.
Figure 7:
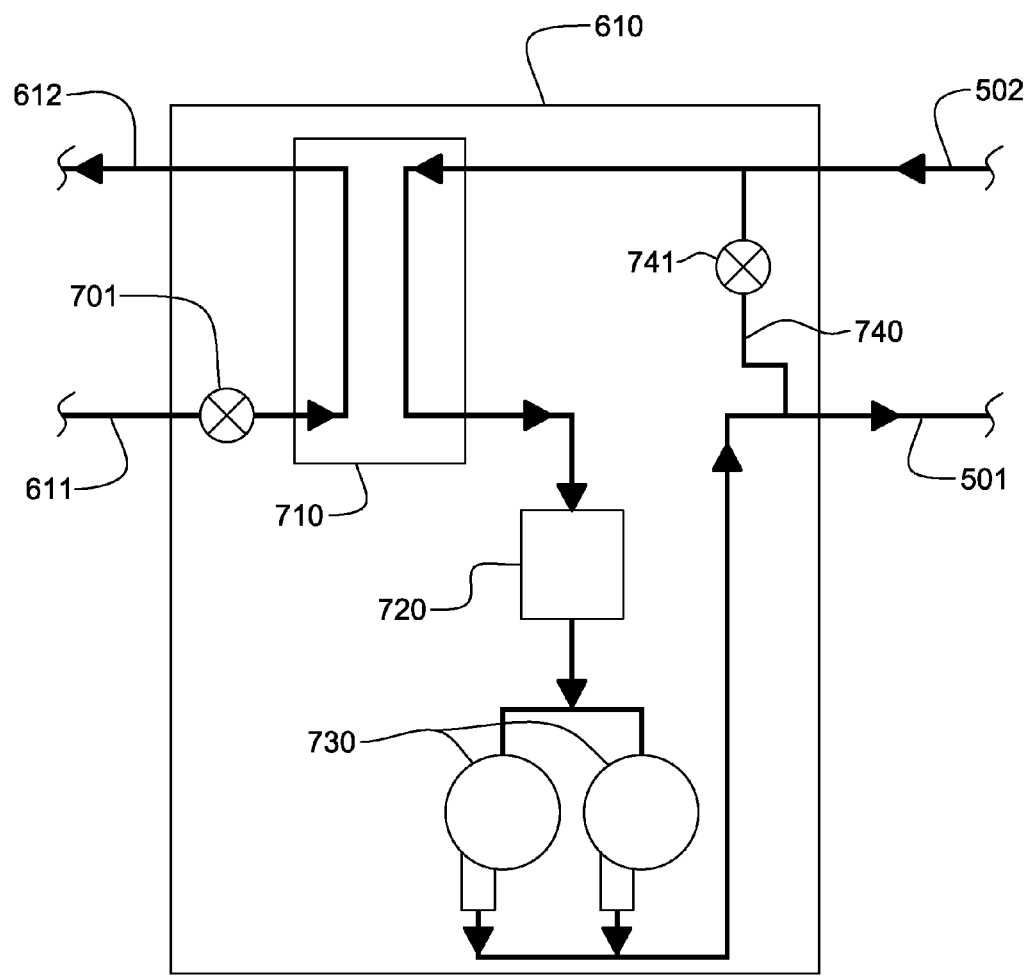
FIG. 7 is a schematic of one embodiment of a coolant distribution unit illustrated in the data center of FIG. 6, in accordance with an aspect of the present invention.

FIGS. 5-7 depict an alternate implementation of a dehumidifying and re-humidifying cooling apparatus for an electronics rack 300', in accordance with an aspect of the present invention. Unless otherwise started, this dehumidifying and re-humidifying cooling apparatus is identical to that described in connection with FIG. 3B. Referring first to FIG. 5, one or more coolant distribution units within the data center are employed to provide chilled coolant via a coolant loop 500 (comprising a coolant supply line 501 and a coolant return line 502) coupling a respective coolant distribution unit and air-to-liquid heat exchanger 320 in fluid communication. Further, by way of example, modular refrigeration unit (MRU) 200 is depicted within electronics rack 300' coupled via a refrigerant loop 315 to sub-ambient evaporators coupled to one or more processor modules to be cooled 311. Alternatively, water-based cooling could be employed with the electronics rack in combination with the dehumidifying and re-humidifying cooling apparatus depicted in FIGS. 5-7.

FIGS. 6 & 7 depict embodiments of a data center and coolant distribution unit, respectively, which may be employed with a dehumidifying and re-humidifying cooling apparatus such as depicted in FIG. 5.

FIG. 6 depicts one embodiment of a data center, generally denoted 600, employing cooled electronics systems, in accordance with an aspect of the present invention. Data center 600 includes a plurality of rows of electronics racks 300', each of which includes a perforated front door 303 and perforated rear door 304, such as described above in connection with the embodiment of FIGS. 3A & 3B. Each perforated front door 303 supports an air-to-liquid heat exchanger of a dehumidifying and re-humidifying cooling apparatus such as described above in connection with FIG. 5. Each perforated rear door 304 includes a condensate evaporator for re-humidifying the exhaust air egressing from the electronics rack. Multiple coolant distribution units 610, referred to hereinbelow as pumping units, are disposed within the data center (along with one or more air-conditioning units (not shown)). In this embodiment, each pumping unit forms a coolant distribution subsystem with one row of a plurality of electronics racks. Each pumping unit includes a liquid-to-liquid heat exchanger where heat is transferred from a heat exchanger coolant loop to a facility coolant loop. Chilled facility coolant, such as water, is received via a facility coolant supply line 611, and is returned via a facility coolant return line 612. Coolant, such as water, is provided via a coolant loop 500 (comprising the illustrated coolant supply and return lines). In one embodiment, coolant supply and return lines of coolant loop 500 are hard-plumbed within the data center, and preconfigured to align under and include branch lines extending towards the electronics racks of the respective row of electronics racks.

FIG. 7 depicts one embodiment of a coolant distribution unit 610 for the data center 600 of FIG. 6. Liquid-to-liquid heat exchanger 710 cools coolant passing through the coolant loop comprising coolant supply line 501 and coolant return line 502. (In one embodiment, the coolant has undergone heating within the respective air-to-liquid heat exchangers disposed within the perforated front doors of the electronics racks.) The facility coolant loop of liquid-to-liquid heat exchanger 710 comprises facility coolant supply line 611 and facility coolant return line 612, which in one embodiment, provide chilled facility water to the liquid-to-liquid heat exchanger. A control valve 701 may be employed in facility coolant supply line 611 to control facility coolant flow rate through the liquid-to-liquid heat exchanger 710. After the system coolant is cooled within liquid-to-liquid heat exchanger 710, the coolant is collected in a reservoir 720 for pumping via a redundant pump assembly 730 back to the respective row of electronics racks via coolant supply line 501. As shown in FIG. 7, a bypass line 740 with a bypass valve 741 may be employed to control the amount of coolant fed back through the coolant supply line, and hence, control temperature of coolant delivered to the respective dehumidifying air-to-liquid heat exchangers mounted to the doors of the electronics racks.

Figure 8:
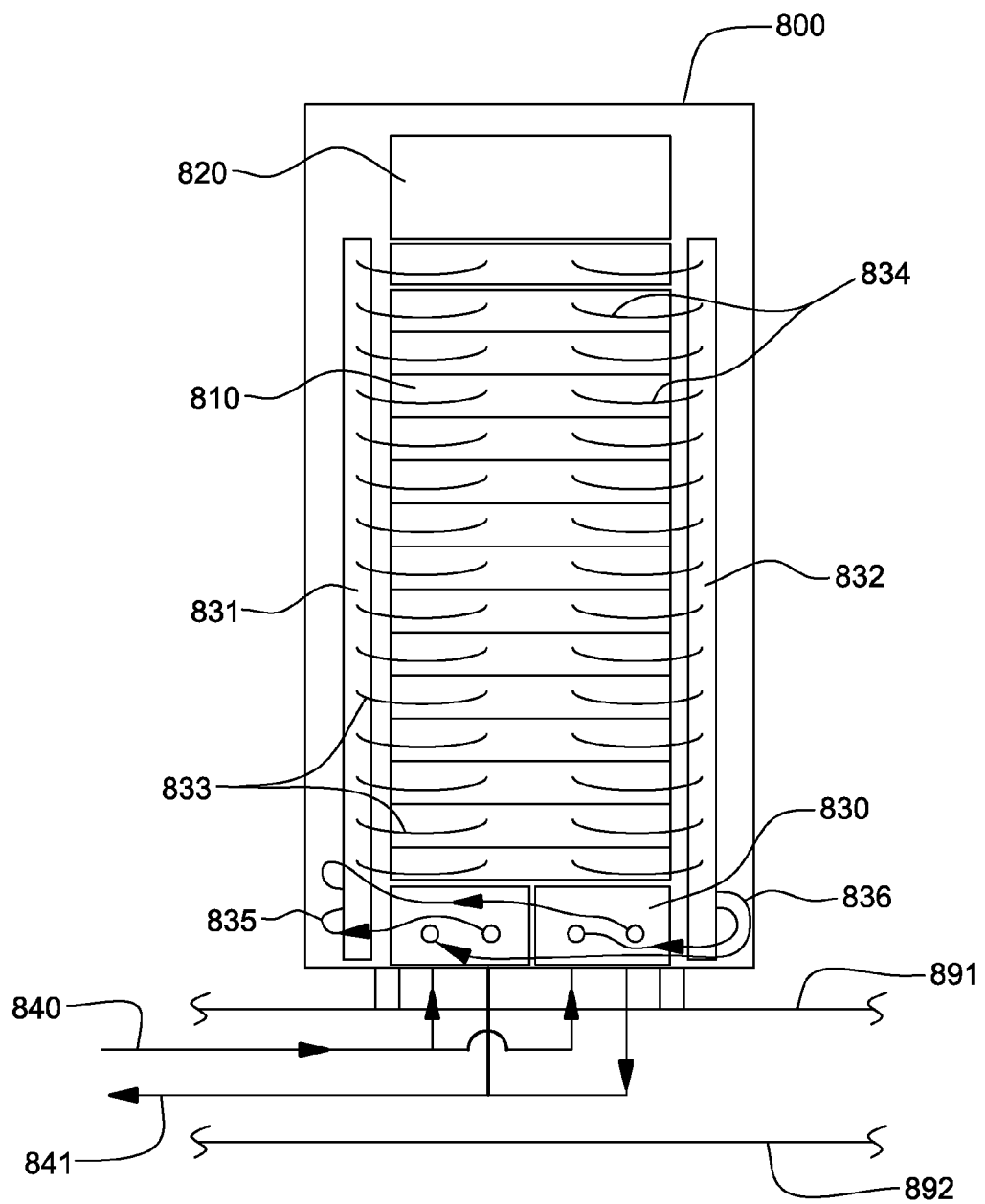
FIG. 8 is an elevational view of one embodiment of a liquid-cooled electronics rack comprising multiple liquid-cooled electronics subsystems to be cooled, in accordance with an aspect of the present invention.
Figure 9:
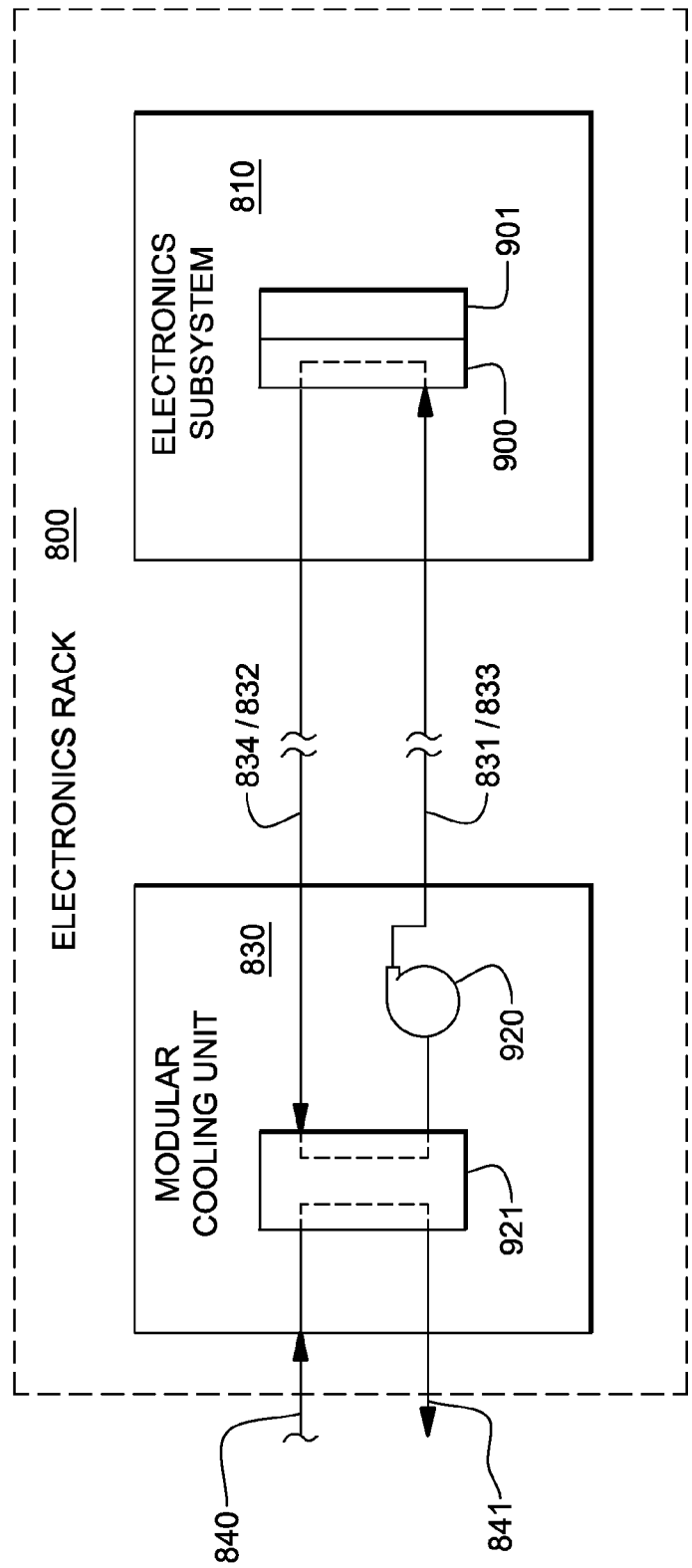
FIG. 9 is a partial schematic of the liquid-cooled electronics rack of FIG. 8, wherein an electronic component (e.g., module) is liquid-cooled by system coolant provided by one or more modular cooling units disposed within the electronics rack, in accordance with an aspect of the present invention.
Figure 10:
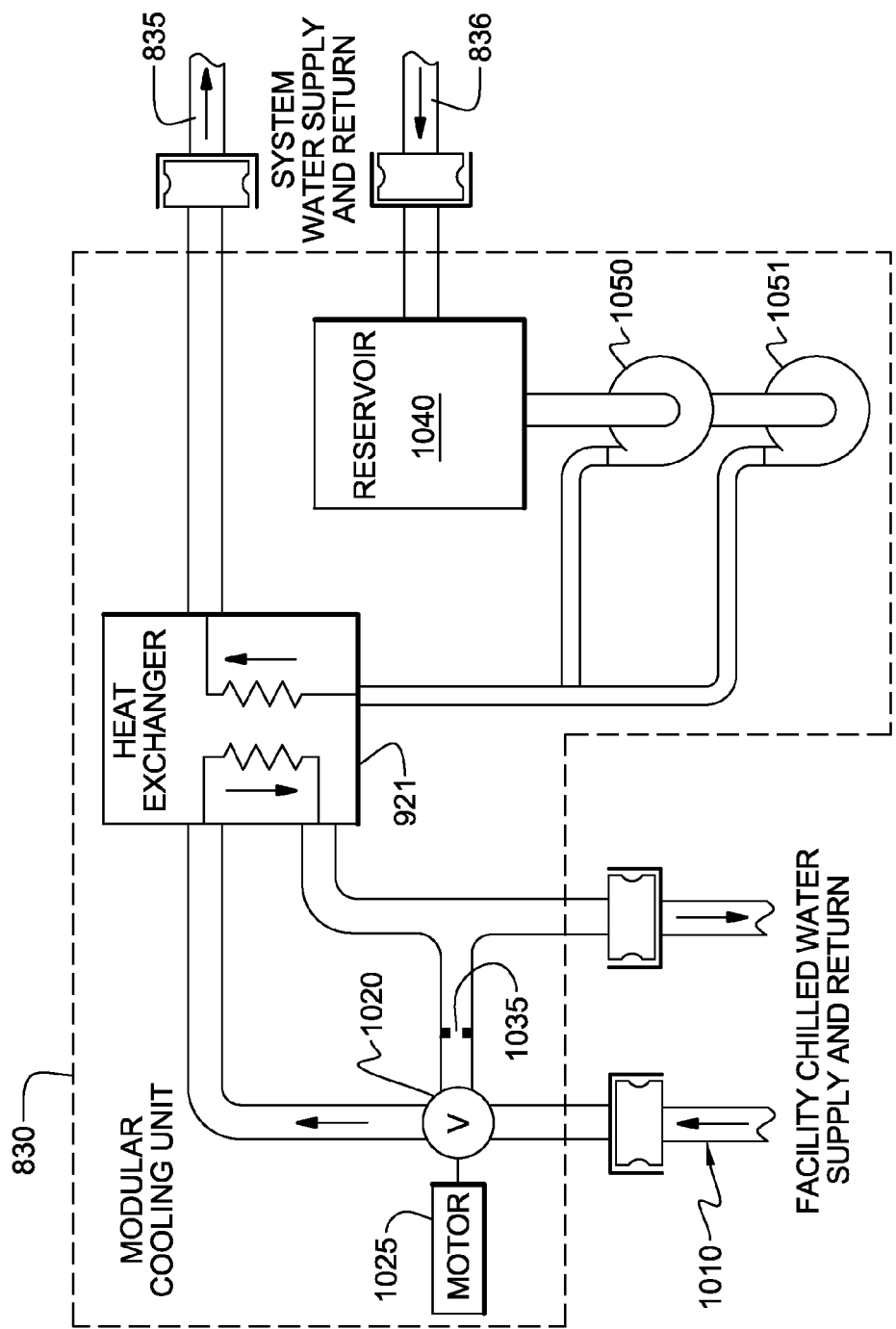
FIG. 10 is a schematic of one embodiment of a modular cooling unit for the liquid-cooled electronics rack of FIGS. 8 & 9, in accordance with one aspect of the present invention.
Figure 11:
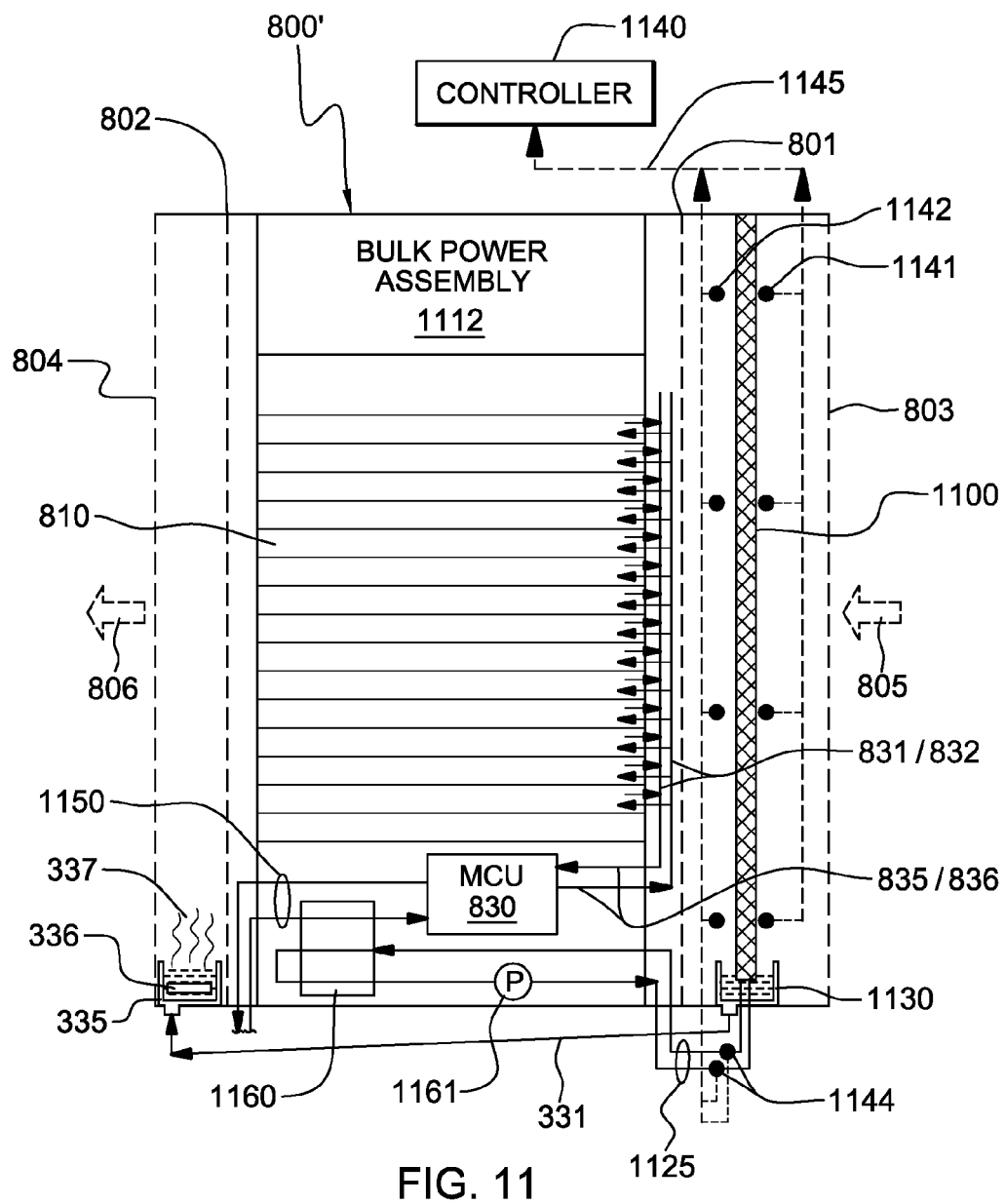
FIG. 11 is a cross-sectional elevational view of one embodiment of a liquid-cooled electronics rack such as depicted in FIGS. 8-10, and a dehumidifying and re-humidifying cooling apparatus therefor, in accordance with an aspect of the present invention.
Figure 12:
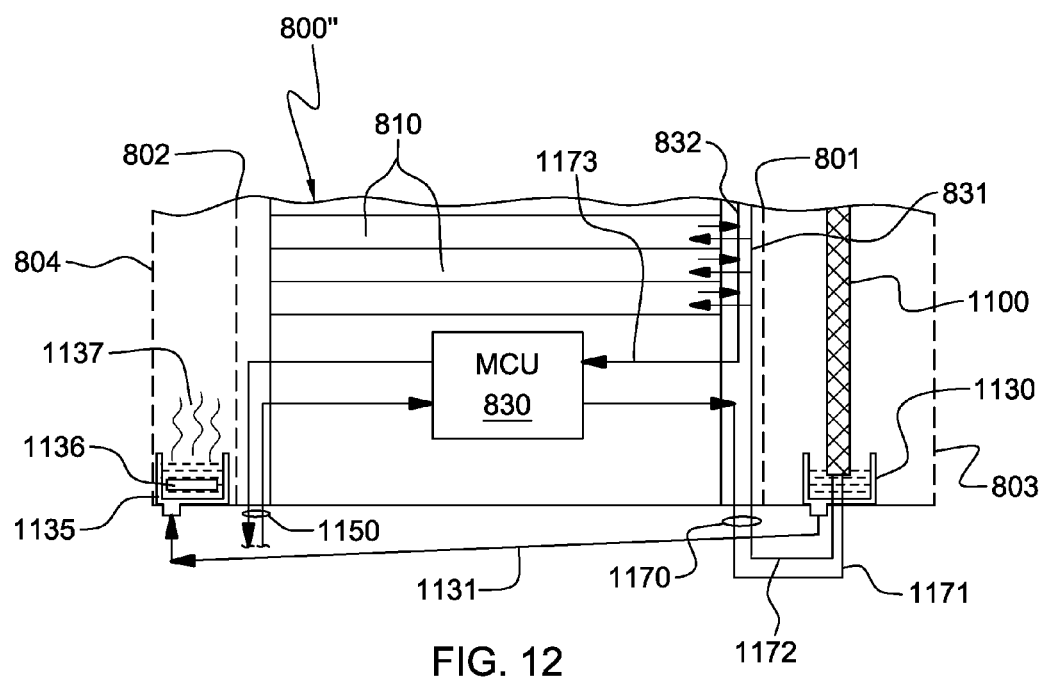
FIG. 12 is a partial cross-sectional elevational view of an alternate embodiment of a liquid-cooled electronics rack such as depicted in FIGS. 8-10, and a dehumidifying and re-humidifying cooling apparatus therefor, in accordance with an aspect of the present invention.

FIGS. 8-10 depict one embodiment of a liquid-cooled electronics rack comprising multiple liquid-cooled electronic subsystems. The dehumidifying and re-humidifying cooling apparatus disclosed herein may also be employed in connection with such a liquid-cooled electronics rack. Embodiments of the resultant cooled electronic system are depicted in FIGS. 11 & 12, which are described below.

FIG. 8 depicts one embodiment of a liquid-cooled electronics rack 800. As illustrated, liquid-cooled electronics rack 800 comprises a plurality of electronics subsystems 810, which may be processor or server nodes. A bulk power regulator 820 is shown disposed at an upper portion of liquid-cooled electronics rack 800, and two modular cooling units (MCUs) 830 are disposed in a lower portion of the liquid-cooled electronics rack. In the embodiments described herein, the coolant is assumed to be water or an aqueous-based solution (by way of example only).

In addition to MCUs 830, the cooling system includes a system water supply manifold 831, a system water return manifold 832, and manifold-to-node fluid connect hoses 833 coupling system water supply manifold 831 to electronics subsystems 810, and node-to-manifold fluid connect hoses 834 coupling the individual electronics subsystems 810 to system water return manifold 832. Each MCU 830 is in fluid communication with system water supply manifold 831 via a respective system water supply hose 835, and each MCU 830 is in fluid communication with system water return manifold 832 via a respective system water return hose 836.

As illustrated, the heat load of the electronics subsystems is transferred from the system water to cooler facility water supplied by facility water supply line 840 and facility water return line 841 disposed, in the illustrated embodiment, in the space between a raised floor 891 and a base floor 892.

FIG. 9 schematically illustrates operation of the cooling system of FIG. 8, wherein a liquid-cooled cold plate 900 is shown coupled to an electronics module 901 of an electronics subsystem 810 within the liquid-cooled electronics rack 800. Heat is removed from electronics module 901 via the system coolant circulated via pump 920 through cold plate 900 within the system coolant loop defined by liquid-to-liquid heat exchanger 921 of modular cooling unit 830, lines 831/833, 834/832 and cold plate 900. The system coolant loop and modular cooling unit are designed to provide coolant of a controlled temperature and pressure, as well as controlled chemistry and cleanliness, to facilitate cooling of the electronics module(s). Furthermore, the system coolant is physically separate from the less controlled facility coolant in lines 840, 841, to which heat is ultimately transferred.

FIG. 10 depicts a more detailed embodiment of a modular cooling unit 830. As shown in FIG. 10, modular cooling unit 830 includes a first cooling loop wherein building chilled, facility coolant is supplied 1010 and passes through a control valve 1020 driven by a motor 1025. Valve 1020 determines an amount of facility coolant to be passed through liquid-to-liquid heat exchanger 921, with a portion of the facility coolant possibly being returned directly via a bypass orifice 1035. The modular cooling unit further includes a second cooling loop with a reservoir tank 1040 from which system coolant is pumped, either by pump 1050 or pump 1051, into the liquid-to-liquid heat exchanger 921 for conditioning and output thereof, as cooled system coolant to the subsystems of the electronics rack to be cooled. The cooled system coolant flows to and from the system water supply manifold and system water return manifold, respectively, of the liquid-cooled electronics rack via the system water supply hose 835 and system water return hose 836.

As noted, FIGS. 11 & 12 depict one embodiment of a liquid-cooled electronics rack, such as described above in connection with FIGS. 8-10, in combination with a dehumidifying and re-humidifying cooling apparatus, such as disclosed herein.

In FIG. 11, a liquid-cooled electronics rack 800' is illustrated comprising a plurality of electronic subsystems 810, which may be processor or server nodes. Ambient air 805 ingresses via an air inlet side 801 of electronics rack 800' through a perforated front door 803, and exhaust air 806 exiting from an air outlet side 802 of electronics rack 800' egresses via a perforated rear door 804. Electronic subsystems 810 are liquid-cooled via one or more modular cooling units 830 which provide a first cooled system coolant thereto via coolant supply and return lines 835, 836 coupling modular cooling unit 830 to coolant inlet and return manifolds 831, 832, respectively. Respective manifold-to-node fluid connect hoses couple the coolant inlet and return manifolds to the respective electronic subsystems 810. A facility coolant loop 1150 provides facility coolant to the liquid-to-liquid heat exchanger within modular cooling unit 830.

In this implementation, the dehumidifying and re-humidifying cooling apparatus includes a dehumidifying air-to-liquid heat exchanger 1100 cooled via a coolant flowing through a coolant loop 1125. This coolant within coolant loop 1125 is cooled via an auxiliary liquid-to-liquid heat exchanger 1160, through which, in this example, the chilled facility coolant passes before being supplied to modular cooling unit 830. An auxiliary pump 1161 pumps coolant through coolant loop 1125 to cool the surfaces of the dehumidifying air-to-liquid heat exchanger to a sub-ambient temperature to facilitate formation of condensate thereon. A condensate collector 1130 disposed, for example, below dehumidifying air-to-liquid heat exchanger 1100, collects liquid condensate resulting from dehumidifying the ingressing ambient air by the air-to-liquid heat exchanger. This liquid condensate is fed via a gravity feed line 331 to a condensate evaporator 335, which includes one or more adjustable heaters 336 for controlling the rate of condensate evaporation 337, and thus, the degree of re-humidifying applied to egressing exhaust air from electronics rack 800' to produce re-humidified exhaust air 806.

The dehumidifying and re-humidifying cooling apparatus further includes a controller 1140, which is coupled via data cables 1145 to rack inlet temperature and relative humidity sensors 1141 and server inlet temperature and relative humidity sensors 1142, as well as to temperature sensors 1144 sensing the temperature of coolant being delivered to dehumidifying air-to-liquid heat exchanger 1100, and exhausting from the air-to-liquid heat exchanger via coolant loop 1125.

In operation, humid ambient air enters through perforated front door 803, where excess moisture is condensed upon contacting the surfaces of the dehumidifying air-to-liquid heat exchanger. Heat gained within the coolant loop at the dehumidifying air-to-liquid heat exchanger is via latent and sensible heat transfer mechanisms, and is subsequently rejected via sensible heat transfer in the auxiliary liquid-to-liquid heat exchanger 1160. Water condensate collected at the condensate collector within the perforated front door is transferred to the condensate evaporator at the rear door for re-humidifying of the egressing exhaust air passing through the perforated rear door 804. The temperature and relative humidity sensors on either side of the air-to-liquid heat exchanger collect ambient air data at the inlet of the perforated front door and the inlet to the servers, to ensure that an appropriate amount of chilled coolant is being provided to the dehumidifying air-to-liquid heat exchanger to facilitate removal of a specific amount of moisture from the air stream. As in the embodiments of the refrigerant-cooled modules depicted in FIGS. 3A-5, the dehumidifying and re-humidifying cooling apparatus of FIG. 11 is operated to ensure that ambient air entering the electronic subsystems (e.g., servers) is appropriately dehumidified to avoid undesirable condensation of water in close proximity to electronic components.

FIG. 12 depicts an alternate embodiment of a dehumidifying and re-humidifying cooling apparatus for a liquid-cooled electronics rack such as depicted in FIGS. 8-10. In this embodiment, modular cooling unit 830 supplies chilled system coolant via a chilled coolant supply line 1171 to dehumidifying air-to-liquid heat exchanger 1100. A system coolant return line 1172 from dehumidifying air-to-liquid heat exchanger 1100 couples the air-to-liquid heat exchanger to the system water supply manifold 831 for delivery thereof via the node-to-manifold fluid connect hoses to the electronic subsystems 810 of liquid-cooled electronics rack 800". Exhaust system coolant from the electronic subsystems is returned via system water return manifold 832 in fluid communication with modular cooling unit 830 via a return line 1173. As in the other embodiments of the dehumidifying and re-humidifying cooling apparatus, ambient air passes through perforated front door 803 across dehumidifying air-to-liquid heat exchanger 1100, and through air inlet side 801 of liquid-cooled electronics rack 800", for facilitating cooling of electronic components within the rack, and is then expelled through air outlet side 802 of electronics rack 800" via a perforated rear door 804. Liquid condensate is collected in a condensate collector 803, for example, disposed at the bottom of dehumidifying air-to-liquid heat exchanger 1100, and is subsequently gravity-fed 1131 to a condensate evaporator 1135, which includes one or more water heaters 1136 for controlling the rate of evaporation 1137 of the liquid condensate at the perforated rear door 804 for re-humidifying the egressing exhaust air from the electronics rack before passing into the data center. A facility coolant loop 1150 supplies facility coolant to each MCU 830 to facilitate cooling of the system coolant flowing through the dehumidifying air-to-liquid heat exchanger and liquid-cooled electronic subsystems.

Note that in the dehumidifying and re-humidifying cooling apparatus embodiment of FIG. 12, there is no dedicated liquid-to-liquid heat exchanger or pump external to the modular cooling unit to provide the below dew point chilled coolant (e.g., water) to the dehumidifying air-to-liquid heat exchanger. In the embodiment illustrated, the modular cooling unit itself is used to chill the system coolant temperature to below a dew point temperature of the ambient air entering the electronics rack, and this chilled coolant is first passed through the dehumidifying air-to-liquid heat exchanger, and subsequently through the liquid-cooled electronic subsystems in series fluid communication with the dehumidifying air-to-liquid heat exchanger. In the embodiments of FIGS. 11 & 12, the liquid-cooled electronic subsystems can be cooled with water significantly below the data center's ambient air dew point, leading to a greater heat transfer capability of the modular cooling unit under relatively humid conditions, e.g., humidity conditions which might be out-of-specification for the electronics rack.

FIGS. 13-19 depict cooled electronic systems employing alternate embodiments of dehumidifying and re-humidifying cooling apparatuses, in accordance with aspects of the present invention.

In certain of these alternate embodiments, a condensate evaporation system is provided which includes a re-humidifying structure disposed at the air outlet side of the electronics rack so that air egressing from the air outlet side of the electronics rack passes through or across the re-humidifying structure. In addition, a condensate delivery mechanism is provided for delivery of liquid condensate from the condensate collector disposed at the air inlet side of the electronics rack to the re-humidifying structure disposed at the air outlet side of the electronics rack, wherein the re-humidifying structure re-humidifies air egressing from the air outlet side of the electronics rack. The condensate evaporation system thus re-injects (in certain embodiments) liquid condensate collected from the inlet air stream at the air inlet side of the electronics rack into the exhaust air stream at the air outlet side of the electronics rack, for example, using pumped delivery of water to surfaces of the re-humidifying structure. Thus, the heater structures illustrated in the cooling apparatus embodiments described above can be eliminated. Also, no new electrical energy is dissipated into the room.

Figure 13:
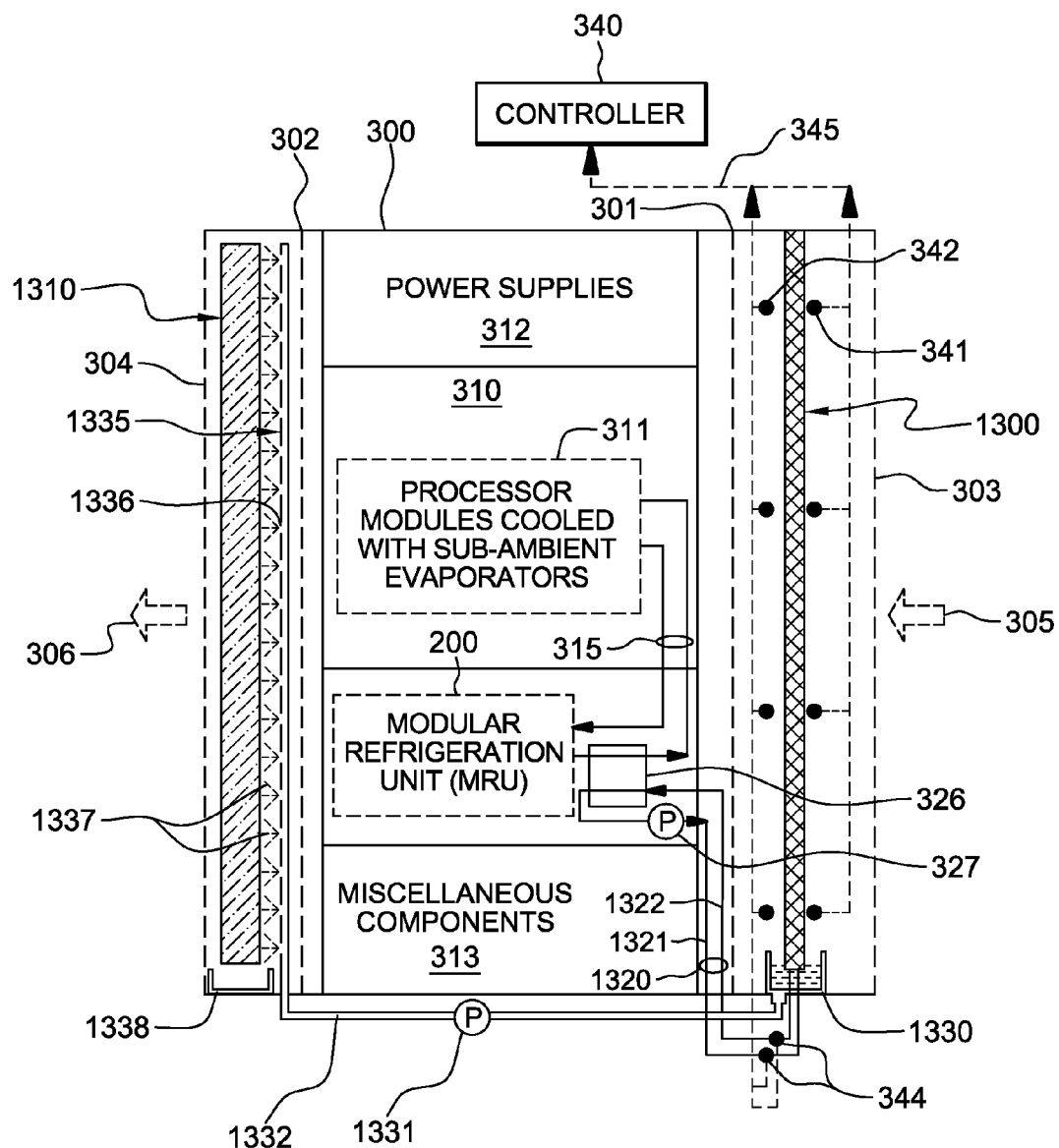
FIG. 13 is a cross-sectional elevational view of the liquid-cooled electronics rack of FIG. 3B, and an alternate embodiment of a dehumidifying and re-humidifying cooling apparatus therefor, in accordance with an aspect of the present invention.

As illustrated in FIG. 13, the dehumidifying and re-humidifying cooling apparatus includes (in one embodiment) a dehumidifying air-to-liquid heat exchanger 1300 disposed at air inlet side 301 of electronics rack 300, for example, within perforated front door 303, and a re-humidifying structure 1310 disposed at air outlet side 302 of electronics rack 300, for example, in perforated rear door 304 of the electronics rack. In operation, humid ambient air 305 ingresses through perforated front door 303, and is dehumidified and cooled by dehumidifying air-to-liquid heat exchanger 1300, before passing through electronics rack 300. Egressing from electronics rack 300 is heated exhaust air, which is re-humidified by passing through re-humidifying structure 1310 before exiting as humid air 306.

In this example, dehumidifying air-to-liquid heat exchanger 1300 is cooled via chilled coolant received through a coolant loop 1320. By way of example, water within coolant loop 1320 is cooled via the liquid-to-liquid heat exchanger 326 in fluid communication with both refrigerant loop 315 and coolant loop 1320. That is, refrigerant exiting modular refrigeration unit 200 passes through liquid-to-liquid heat exchanger 326 and cools (i.e., chills) the coolant within coolant loop 1320 before passing through the sub-ambient evaporators 311. Coolant (e.g., water) is pumped 327 through coolant loop 1320, which includes a coolant supply line 1321 and a coolant return line 1322. As shown, the coolant supply and return lines are connected to supply chilled coolant to the dehumidifying air-to-liquid heat exchanger 1300.

In operation, liquid condensate is collected in a condensate collector 1330 disposed below dehumidifying air-to-liquid heat exchanger 1300 at the air inlet side of the electronics rack, and this liquid condensate is delivered via a condensate delivery mechanism to the re-humidifying structure 1310 at the air outlet side of the electronics rack. In the embodiment illustrated, the condensate delivery mechanism includes a pump 1331 within a feed line 1332, which couples in fluid communication condensate collector 1330 and a condensate supply manifold 1335 disposed in opposing relation to re-humidifying structure 1310 at the air outlet side of the electronics rack. As illustrated, condensate supply manifold 1335 extends for substantially the full height of re-humidifying structure 1310, and has a plurality of openings 1336, such as condensate spray (or jet) openings for providing a spray 1337 of water onto exposed surfaces of re-humidifying air structure 1310. A water collector 1338 is disposed below re-humidifying structure 1310 to collect any water dripping below the structure. During operation, water leaves the condensate supply manifold at various points along the vertical manifold and forms sprays that wet the re-humidifying structure surfaces. This water temporarily resides on the re-humidifying structure surfaces forming a thin film of liquid on the solid surfaces, which subsequently evaporates into the exhaust air stream that is flowing through or across the re-humidifying structure.

By way of further example, condensate supply manifold 1335 may comprise a series of vertical pipes disposed at the air outlet side of the electronics rack, which are configured with a plurality of exit ports terminated with spray or jet nozzles. These vertical pipes can be disposed (in one example) along the two vertical sides of the re-humidifying structure, with the jets (or sprays) being directed at various angles to allow the condensate to be sprayed over the entire horizontal and vertical breadth of the re-humidifying structure.

To accommodate such an angled spray or jet flow, the pipes can be spaced at some horizontal distance from the re-humidifying structure plane, to which the condensate flow is directed. Also, to accomplish this condensate flow, some of the nozzles may be directed towards one or the other of the vertical sides of the re-humidifying structure, while other nozzles may be directed towards the central region of the re-humidifying structure. The use of vertical pipes located at the sides of the re-humidifying structure advantageously results in minimal obstruction to the electronics rack exhaust airflow (due to the presence of condensate-carrying pipes), while at the same time allowing for better access to the entire frontal airflow area of the re-humidifying structure for the purpose of injecting condensate into the warm air stream via film-based evaporation off exposed surfaces of the re-humidifying structure.

The condensate supply manifold(s) 1335 is designed to allow for either equal flow through each nozzle, or varying flow that can be optimized for specific requirements. For example, it is possible to design the condensate supply manifolds with the knowledge that the upper region of the electronics rack may have a higher heat load resulting from greater server density, which would produce a higher hot exhaust airflow egressing from the electronics rack. In such a configuration, more condensate spray can be directed at the upper region of the re-humidifying structure to fully explore the greater capacity of the hotter air exiting the top of the electronics rack to evaporate off moisture from the surfaces of the re-humidifying structure. Alternatively, greater condensate flow could be directed towards the central region of the re-humidifying structure in anticipation of greater airflow passing through the central region in certain electronics rack applications. Yet another flow configuration might be to provide greater condensate dispensing at the top of the re-humidifying structure with anticipation that a certain amount of condensate will drip down through the re-humidifying structure via gravity.

As explained further below, the re-humidifying structure 1310 may be (in one embodiment) a wicking structure which disperses liquid condensate throughout the structure, and thus facilitates evaporation of liquid condensate to the egressing air stream passing through the re-humidifying structure. As one example, aluminum or polymer foam wicking material could be employed with airflow openings provided through the material to facilitate passage of egressing air through the re-humidifying structure. As an alternative embodiment, the wicking structure could be a polymer cloth material stretched across the air outlet side of the electronics rack, for example, within the perforated rear door, which itself would have perforations to reduce airflow pressure drop through the polymer cloth. In addition to providing surfaces for formation of a thin film of liquid condensate, the wicking structure advantageously facilitates dispersion of the liquid condensate throughout the structure to, for example, to facilitate more uniform humidification of air egressing from the electronics rack. In other embodiments, the re-humidifying structure may be a relatively thick or layered metallic screen structure which provides surfaces for re-humidifying the egressing air stream passing through the re-humidifying structure.

Also, note with respect to the cooled electronic system of FIG. 13, that the heater control of FIG. 3D could be replaced with an analogous control process for controlling pump 1331 within feed line 1332. For example, liquid condensate level within condensate collector 1330 may be monitored by the controller 340 and when water level exceeds a high level threshold, condensate pump 1331 may be turned ON (or remain ON). Otherwise, if the liquid condensate level within the condensate collector is below the high level threshold, then condensate pump 1331 may be turned OFF (or remain OFF). After waiting a time t, the process would repeat. As a variation, rather than turning the pump ON or OFF, pump speed could be varied based on whether the liquid condensate within the condensate collector is above a high level threshold, or below a low level threshold. As a further variation, condensate level within, for example, the condensate supply manifold may be monitored and employed in adjusting pump speed. Note that the dehumidifying air-to-liquid heat exchanger and the re-humidifying structure would be designed for a broad range of operating parameters, with the condensate pump speed being adjusted for the current conditions.

Figure 14A:
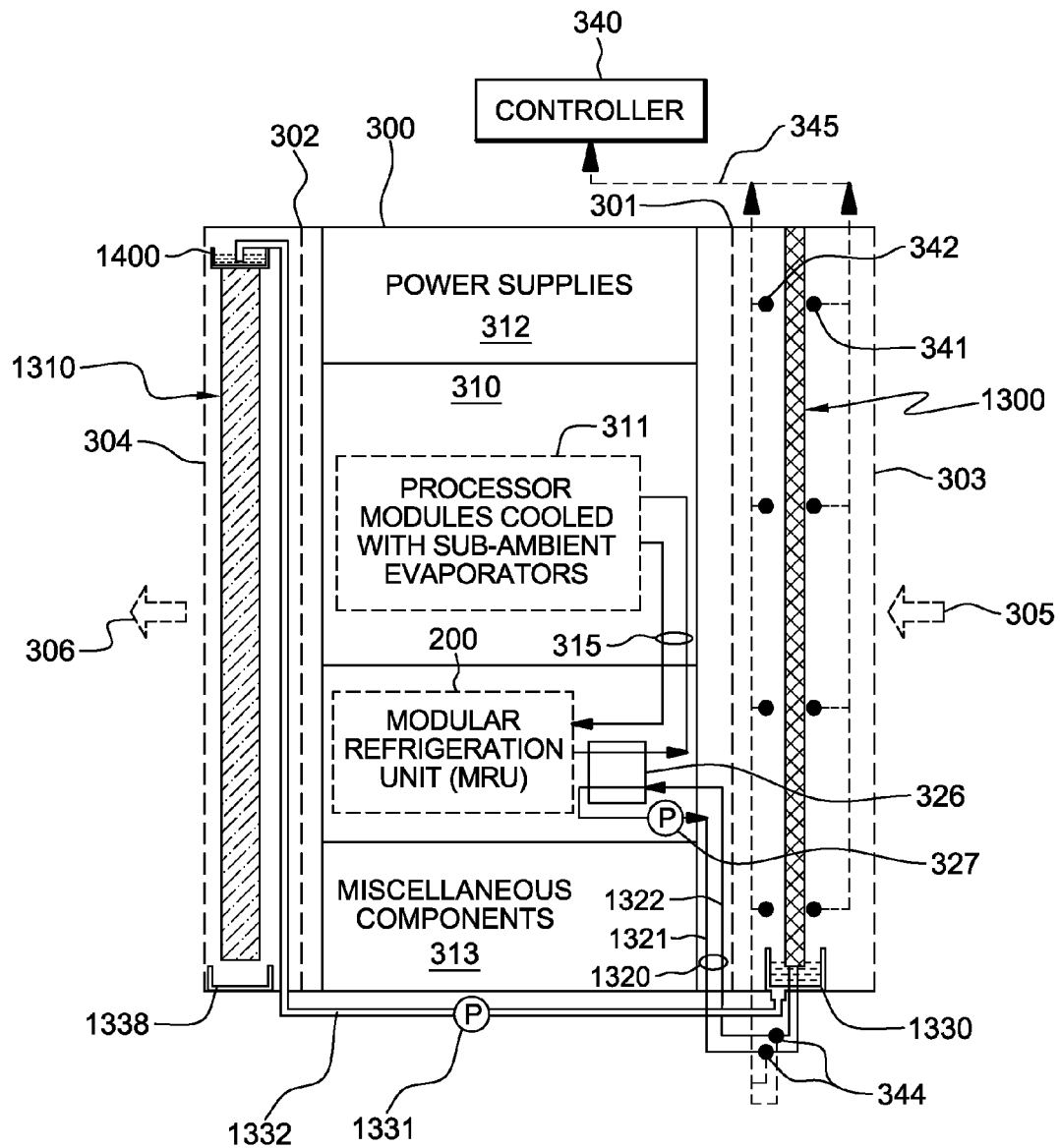
FIG. 14A is a cross-sectional elevational view of the liquid-cooled electronics rack of FIG. 13, and another alternate embodiment of a dehumidifying and re-humidifying cooling apparatus therefor, in accordance with an aspect of the present invention.

FIG. 14A depicts and alternate embodiment of a cooled electronic system similar to the cooled electronic system of FIG. 13, but with an alternate embodiment of a dehumidifying and re-humidifying cooling apparatus, in accordance with an aspect of the present invention. In this alternate embodiment, the cooling apparatus includes dehumidifying air-to-liquid heat exchanger 1300 at the air inlet side of the electronics rack, and re-humidifying structure 1310 at the air outlet side of the electronics rack. The heat exchanger is cooled by a chilled coolant passing through coolant loop 1320, and liquid condensate is collected at the air inlet side of the electronics rack in condensate collector 1330 disposed below dehumidifying air-to-liquid heat exchanger 1300.

Figure 14B:
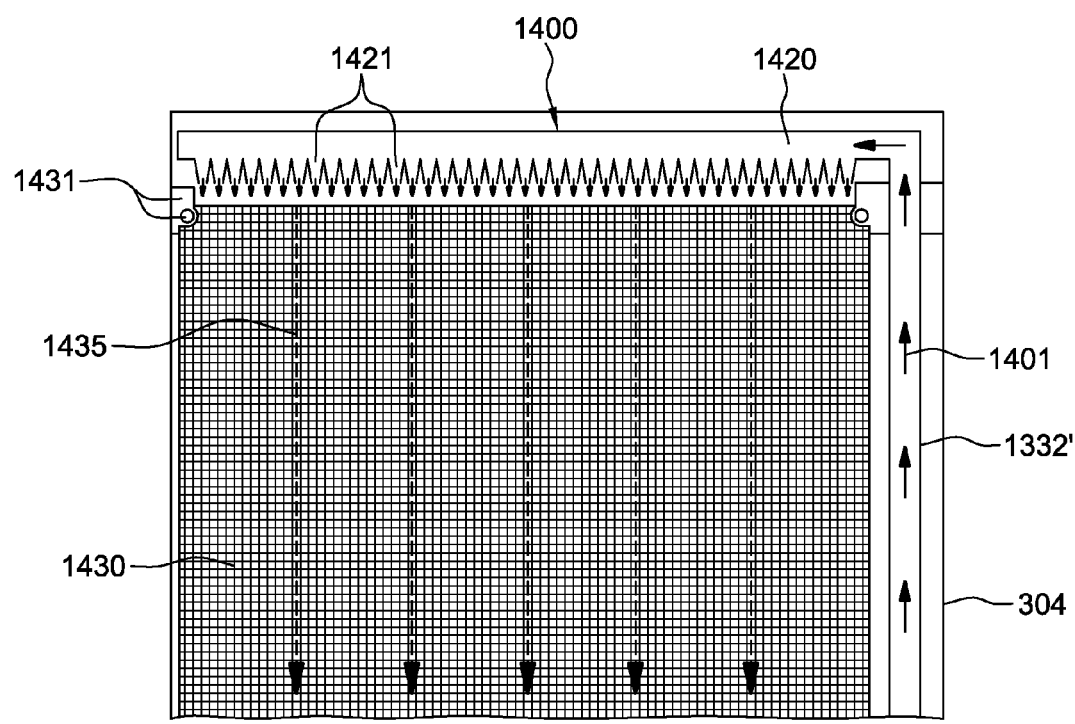
FIG. 14B is a partial elevational view of one embodiment of a condensate evaporation system comprising a re-humidifying structure and a condensate delivery mechanism, in accordance with an aspect of the present invention.
Figure 14C:
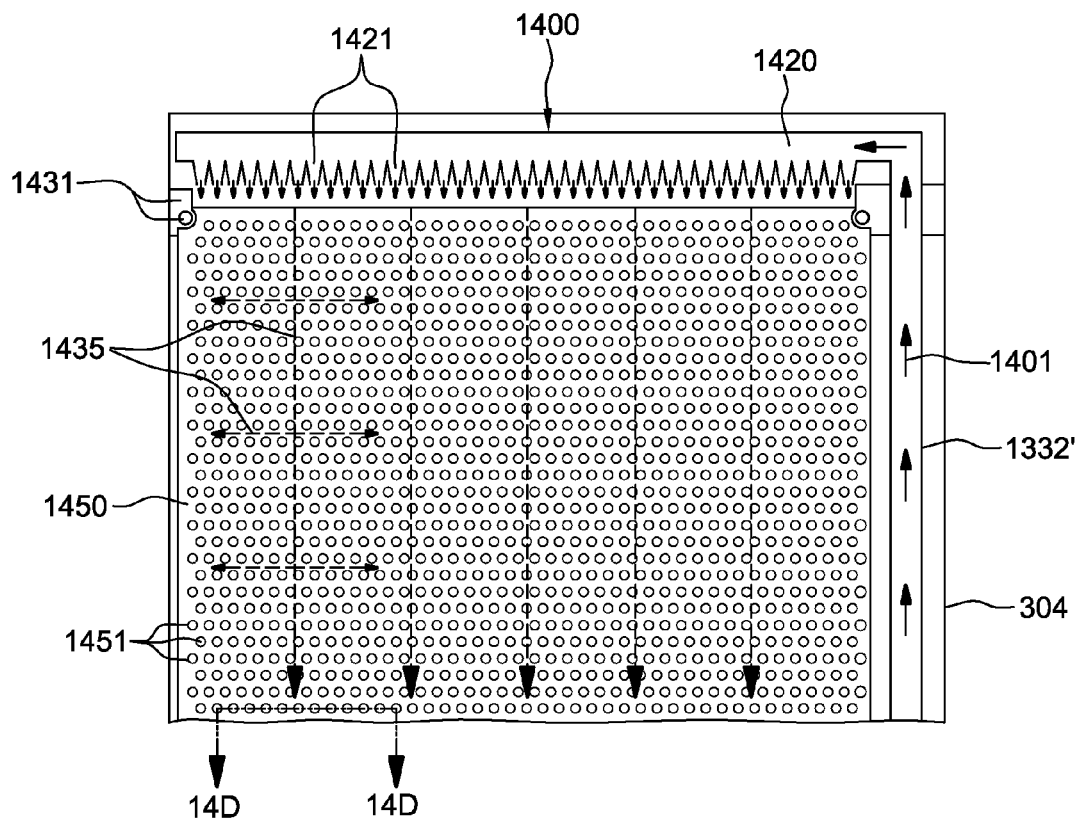
FIG. 14C is a partial elevational view of another embodiment of a condensate evaporation system comprising a re-humidifying structure and a condensate delivery mechanism, in accordance with an aspect of the present invention.
Figure 14D:
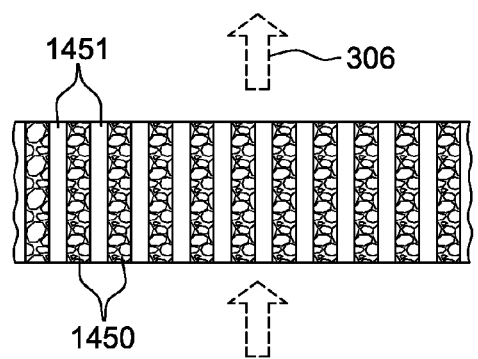
FIG. 14D is a partial cross-sectional view of the re-humidifying structure of FIG. 14C, taken along line 14D-14D, in accordance with an aspect of the present invention.

In this embodiment, pump 1331 pumps the liquid condensate via feed line 1332 to the top of re-humidifying structure 1310 into a condensate drip structure 1400. Condensate drip structure 1400 includes a plurality of openings which allow condensate to drip down via gravity through the surfaces of the re-humidifying structure 1310. FIGS. 14B-14D depict alternate embodiments of such a structure.

In FIG. 14B, a re-humidifying structure is shown (within perforated rear door 304) to comprise a vertical pipe section 1332' feeding liquid condensate 1401 from the condensate collector at the air inlet side of the electronics rack to condensate drip structure 1400, which includes a horizontal condensate distribution plenum 1420 and a plurality of condensate injection nozzles (or orifices) 1421. The re-humidifying structure further includes a vertically-oriented, layered screen structure 1430 held in position at the air outlet side of the electronics rack by mechanical supports 1431. In one implementation, vertically-oriented, layered screen structure 1430 is a metallic structure, with openings to allow for the passage of egressing air through the re-humidifying structure, and a sufficient thickness to provide the desired surface area for evaporation of liquid condensate into the egressing air exiting the electronics rack.

In one implementation, condensate injection nozzles (or orifices) 1421 are located and sized so that droplets of condensate form in a uniform manner across the vertically-extending, layered screen structure 1430. Water 1435 temporarily residing on the screen surfaces forms a thin film which subsequently evaporates into the exhaust air stream that is flowing through the re-humidifying structure. Advantageously, this implementation of a dehumidifying and re-humidifying cooling apparatus requires less pumping energy since the condensate is applied as droplets with gravity feed, rather than being forced through a spray or jet orifice, as in the embodiment of FIG. 13. In all embodiments described herein, the re-humidifying structure can be chemically treated with known protectants to ensure that there is no corrosion or biological growth on the structure's surfaces resulting from the thin films of liquid forming on the surfaces.

FIGS. 14C & 14D depict an alternate embodiment of a re-humidifying structure (again shown within perforated rear door 304). In this embodiment, a vertical pipe section 1332' feeds liquid condensate 1401 from the condensate collector (not shown) at the air inlet side of the electronics rack to a condensate drip structure 1400, which includes a horizontal condensate distribution plenum 1420 and a plurality of condensate injection nozzles (or orifices) 1421. The re-humidifying structure 1450 in this example is a vertically-oriented, porous wicking material with openings 1451 sufficient to achieve an acceptable pressure drop across the re-humidifying structure. By way of example, the illustrated porous wicking structure might comprise a wicking aluminum or polymer foam material with an array of openings formed therein to allow for the desired air flow through the re-humidifying structure. As illustrated in FIG. 14D, warm, dry air egressing from the air outlet side of the electronics rack passes through the vertically-oriented, porous wicking material 1450, and egresses as warm, humid air 306. In the example illustrated, mechanical supports 1431 are disposed at the corners of the vertically-oriented wicking structure. Water 1435 dispenses vertically downwards via gravity, and horizontally outward through the wicking material by a capillary action.

Figure 15:
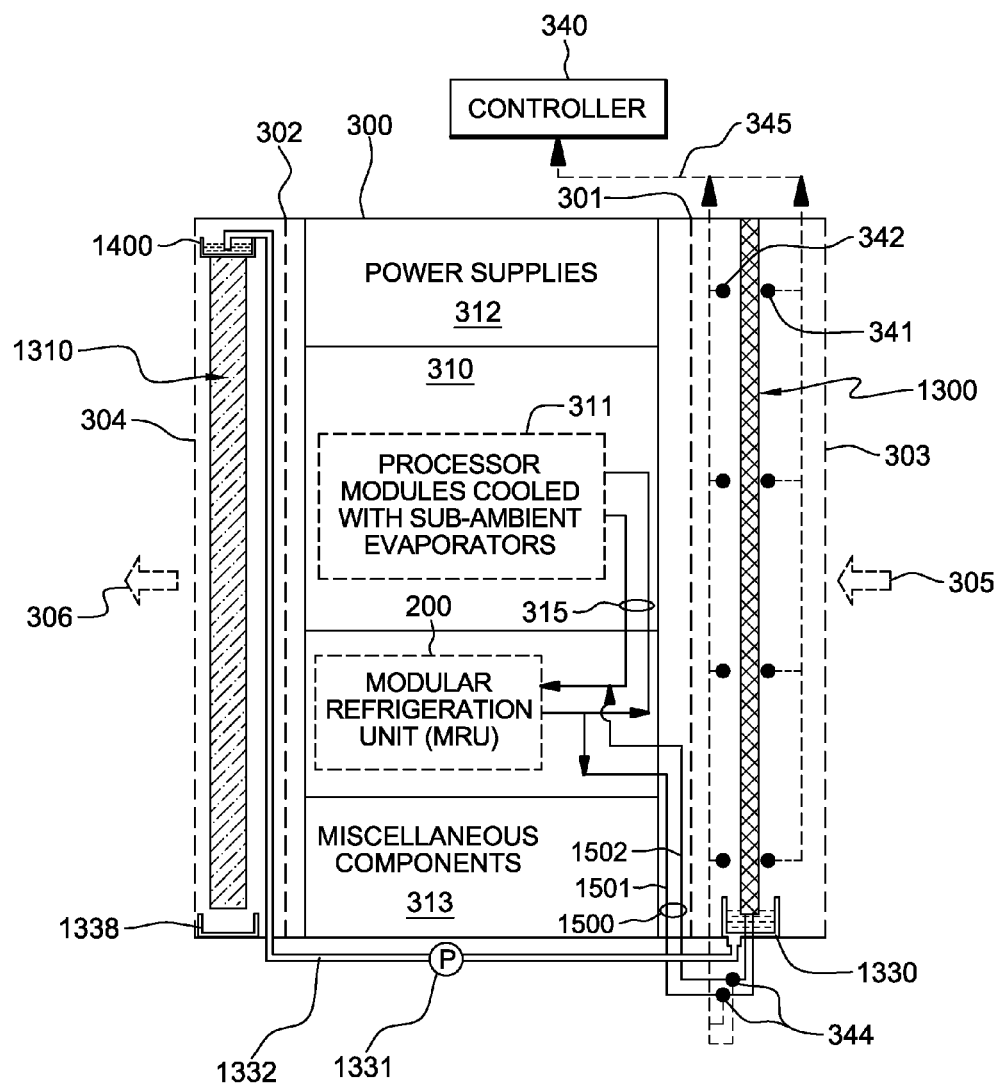
FIG. 15 is a cross-sectional elevational view of the liquid-cooled electronics rack of FIG. 4, and an alternate embodiment of a dehumidifying and re-humidifying cooling apparatus therefor, in accordance with an aspect of the present invention.

FIG. 15 illustrates a further alternate embodiment of a dehumidifying and re-humidifying cooling apparatus, in accordance with an aspect of the present invention. This dehumidifying and re-humidifying cooling apparatus is identical to that described above in connection with FIG. 13, with the exception that a coolant loop 1500 is shown in fluid communication with refrigerant loop 315 coupling modular refrigeration unit 200 to the sub-ambient evaporators coupled to the processor modules being liquid-cooled 311. Thus, in this embodiment, a portion of the chilled refrigerant from modular refrigeration unit 200 is routed via a refrigerant supply line 1501 and a refrigerant return line 1502 through the dehumidifying air-to-liquid heat exchanger 1300.

Advantageously, there is no external pump from the modular refrigeration unit required (or liquid-to-liquid heat exchanger required) in this embodiment, with the modular refrigeration unit compressor and modular refrigeration unit heat exchanger being sized appropriately to allow for pumped refrigerant through the dehumidifying air-to-liquid heat exchanger 1300. The remaining components of the dehumidifying and re-humidifying cooling apparatus depicted in FIG. 15 are similar to the corresponding labeled components described above in connection with FIGS. 3B & 14A. In this implementation, liquid temperature sensors 344 sense temperature of the refrigerant flowing through coolant loop 1500, for example, at the inlet and outlet of dehumidifying air-to-liquid heat exchanger 1300, rather than (for example) water, as in the case of the embodiment of FIG. 14A. Note that as an alternate implementation, the refrigerant could be routed in series, with the sub-ambient evaporators coupled to the processor modules 311 receiving the refrigerant after it has passed through the dehumidifying air-to-liquid heat exchanger 1300.

Figure 16:
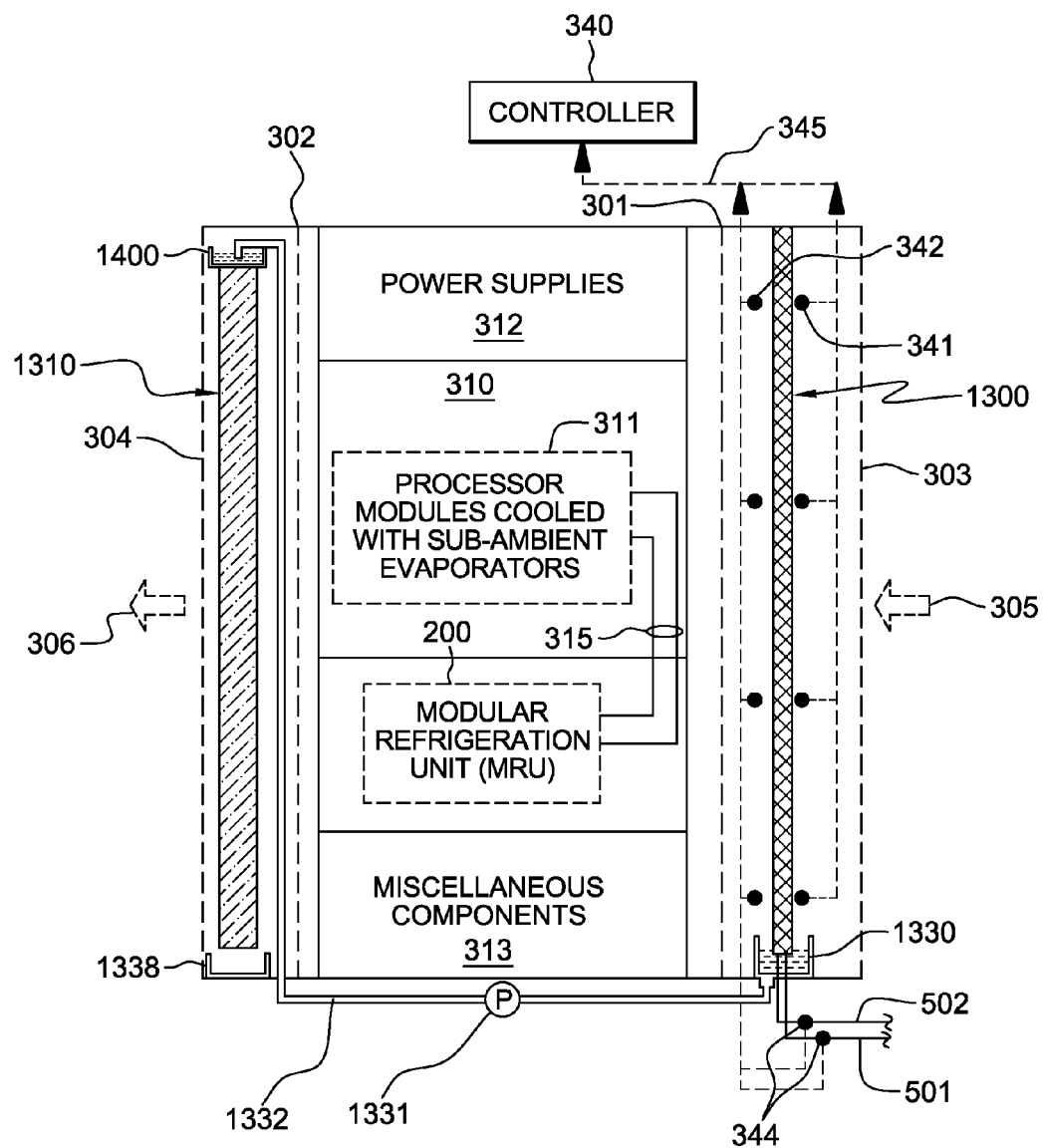
FIG. 16 is a cross-sectional elevational view of the liquid-cooled electronics rack of FIG. 5, and an alternate embodiment of a dehumidifying and re-humidifying cooling apparatus therefor, in accordance with an aspect of the present invention.

FIG. 16 illustrates a further implementation of a dehumidifying and re-humidifying cooling apparatus for an electronics rack, in accordance with an aspect of the present invention. Unless otherwise stated, this dehumidifying and re-humidifying cooling apparatus is similar to that described above in connection with FIGS. 14A & 15. In this embodiment, one or more coolant distribution units, such as described above in connection with the cooling apparatus of FIGS. 5-7 are employed within the data center to provide chilled coolant to dehumidifying air-to-liquid heat exchanger 1300 via a coolant loop comprising a coolant supply line 501 and a coolant return line 502. These lines provide (in one embodiment) chilled coolant, such as water, to the dehumidifying air-to-liquid heat exchanger. By way of example, modular refrigeration unit (MRU) 200 is also depicted within the electronics rack and coupled via refrigerant loop 315 to sub-ambient evaporators coupled to one or more processor modules to be cooled 311. Alternatively, water-based cooling could be employed in the electronics rack in combination with the dehumidifying and re-humidifying cooling apparatus disclosed herein.

As in the embodiments described above, the chilled coolant passing through dehumidifying air-to-liquid heat exchanger 1300 is provided at a temperature below dew point temperature of the air passing across the dehumidifying air-to-liquid heat exchanger, and thus the dehumidifying air-to-liquid heat exchanger dehumidifies ingressing air to the electronics rack. The condensate collector is disposed at the air inlet side of the electronics rack and collects liquid condensate from the dehumidifying air-to-liquid heat exchanger's dehumidifying of ingressing air to the rack. The condensate evaporation system, principally disposed at the air outlet side of the rack, humidifies air egressing from the rack using the collected liquid condensate. Specifically, the condensate evaporation system is coupled in fluid communication with the condensate collector at the air inlet side of the electronics rack for facilitating evaporation of liquid condensate collected by the condensate collector.

In one embodiment, the condensate evaporation system includes a re-humidifying structure 1310, which is mounted to the air outlet side of the electronics rack so that air egressing from the air outlet side of the electronics rack passes through the re-humidifying structure, and a condensate delivery mechanism for delivering liquid condensate from the condensate collector disposed at the air inlet side of the electronics rack to the re-humidifying structure disposed at the air outlet side of the electronics rack. This condensate delivery mechanism may include pump 1331 and feed line 1332 for transporting the liquid condensate from the condensate collector 1330 to, for example, a condensate supply manifold 1335 (as illustrated in FIG. 13) or a condensate drip structure 1400 (as illustrated in FIGS. 14A-16) for delivering the liquid condensate onto surfaces of the re-humidifying structure 1310 for re-humidifying air egressing from the air outlet side of the electronics rack.

Figure 17:
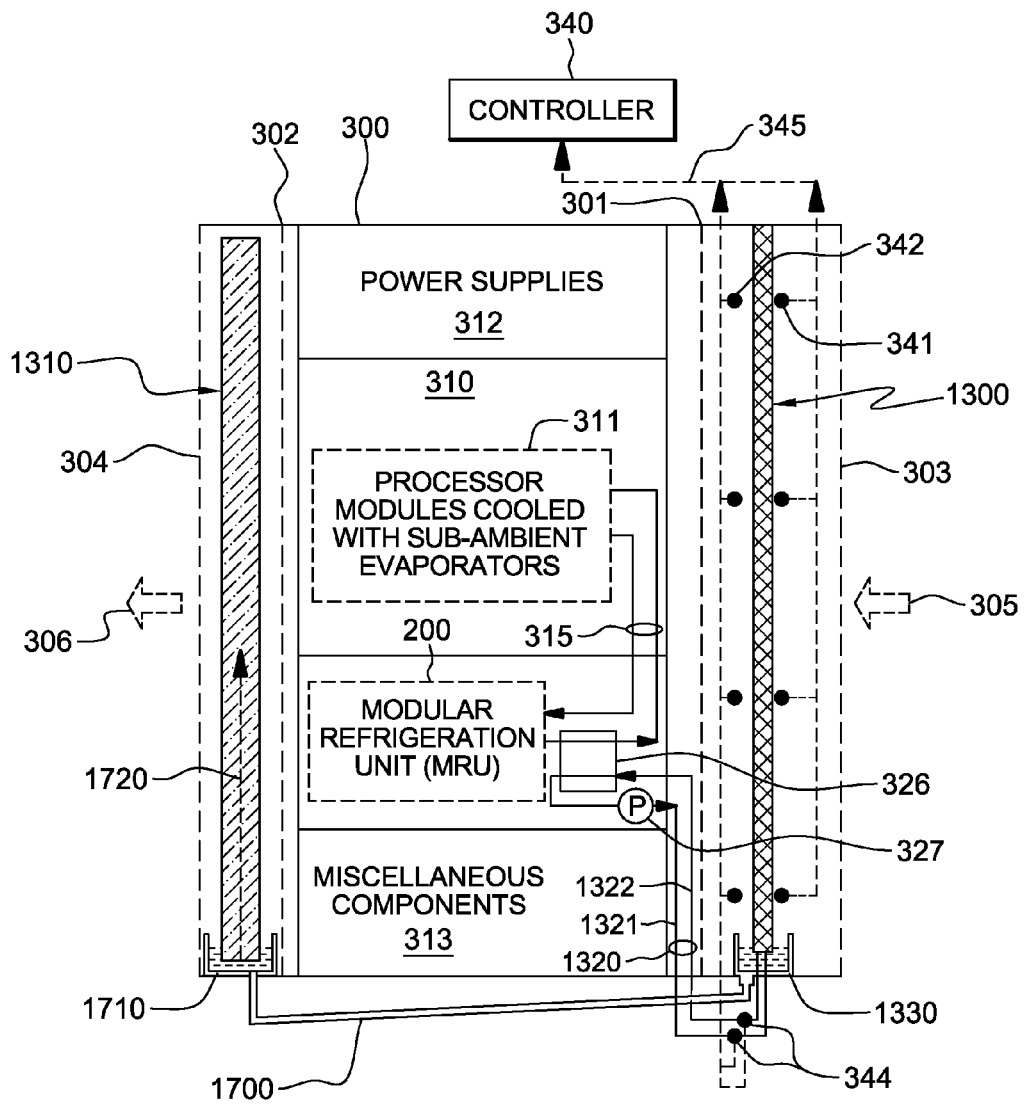
FIG. 17 is a cross-sectional elevational view of the liquid-cooled electronics rack of FIG. 13, and an alternate embodiment of a dehumidifying and re-humidifying cooling apparatus therefor, in accordance with an aspect of the present invention.

FIG. 17 illustrates another implementation of a dehumidifying and re-humidifying cooling apparatus for an electronics rack, in accordance with an aspect of the present invention. Unless otherwise stated, this dehumidifying and re-humidifying cooling apparatus is similar to that described above in connection with FIGS. 13 & 14A. In this embodiment, the cooling apparatus includes dehumidifying air-to-liquid heat exchanger 1300 disposed at the air inlet side of the electronics rack, for example, within perforated front door 303, and a condensate collector 1330 disposed to collect liquid condensate from the dehumidifying air-to-liquid heat exchanger's dehumidifying of the ingressing ambient air. The condensate evaporation system for this cooling apparatus includes a re-humidifying structure 1310 disposed at the air outlet side of the electronics rack and configured and positioned so that air egressing from the air outlet side of the electronics rack passes through re-humidifying structure 1310.

In this implementation, re-humidifying structure 1310 is a wicking structure and is positioned within a condensate container 1710 disposed at the air outlet side of the electronics rack. As shown, liquid condensate is drawn vertically upwards due to capillary forces through the wicking structure. Liquid condensate is delivered via a line 1700 configured to feed (e.g., via gravity) liquid condensate from condensate collector 1330 to condensate container 1710, with the re-humidifying structure 1310 being sized to extend into condensate container 1710 below a liquid level within the condensate container so that the re-humidifying structure contacts the liquid condensate, which is drawn vertically upwards through the wicking structure. As in the embodiments described above, the wicking structure may have an array of openings to facilitate passage of warm exhaust air egressing from the air outlet side of the electronics rack through the re-humidifying structure.

Figure 18A:
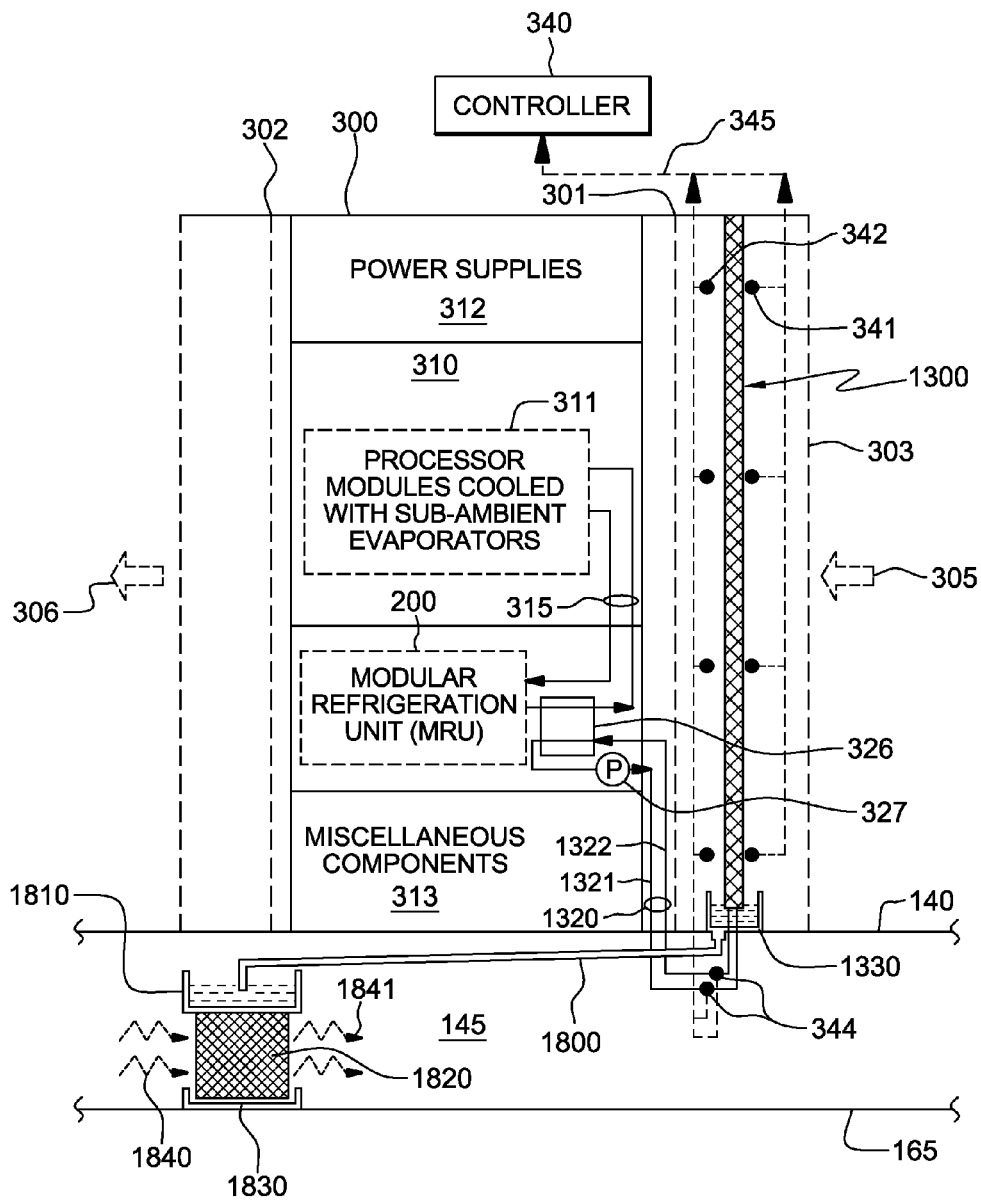
FIG. 18A is a cross-sectional elevational view of the liquid-cooled electronics rack of FIGS. 3B, 13 & 17, and another alternate embodiment of a dehumidifying and re-humidifying cooling apparatus therefor, in accordance with an aspect of the present invention.
Figure 18B:
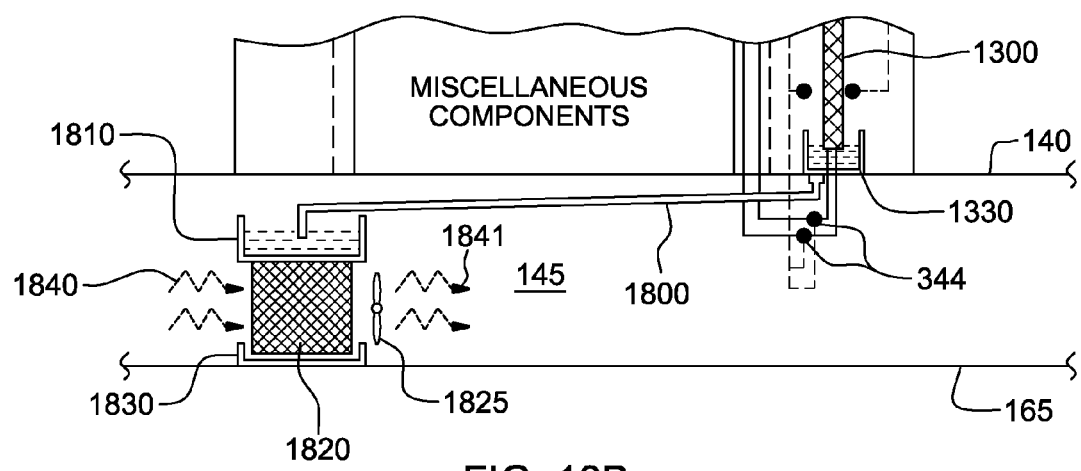
FIG. 18B is a partial cross-sectional elevational view of the liquid-cooled electronics rack of FIG. 18A, and an alternate embodiment of a dehumidifying and re-humidifying cooling apparatus therefor, in accordance with an aspect of the present invention.

FIGS. 18A & 18B depict further embodiments of a cooled electronics system similar to those described above in connection with FIGS. 13, 14A & 17, but with alternate embodiments of a dehumidifying and re-humidifying cooling apparatus, in accordance with an aspect of the present invention. In FIGS. 18A & 18B, electronics rack 300 is illustrated on raised floor 140 of a data center. Raised floor 140 is shown to be spaced above a base or sub-floor 165 of the room to define a supply air plenum 145. Rather than evaporating the liquid condensate back into the hot exhaust air egressing from the air outlet side of the electronics rack, this embodiment advantageously employs gravity to feed the liquid condensate via a line 1800 from condensate collector 1330 to a condensate drip structure 1810 disposed over re-humidifying structure 1820 positioned in the supply air plenum 145 of the data center. As illustrated, an under-floor air stream 1840 flows from left to right through re-humidifying structure 1820, with humidified air 1841 egressing from the re-humidifying structure. A water collector 1830 is disposed below re-humidifying structure 1820 to collect any water dripping below the structure. By way of example, re-humidifying structure 1820 may comprise a wicking structure such as described above, or (for example) a metallic screen structure with a thickness sufficient to provide a specified surface area for facilitating evaporation of liquid condensate into the air stream flowing through re-humidifying structure 1820. As in the embodiments described above in connection with FIGS. 14A, 15 & 16, liquid condensate drips from condensate drip structure 1840 downwards via gravity through the surfaces of re-humidifying structure 1820. By fabricating the re-humidifying structure of a porous wicking material, additional dispersion of the liquid condensate within the structure is facilitated.

FIG. 18B depicts the dehumidifying and re-humidifying cooling apparatus of FIG. 18A, with the addition of an air-moving device 1825 in the air stream flowing through the supply air plenum 145 beneath raised floor 140 of the data center. This air-moving device facilitates drawing (or forcing) air through the re-humidifying structure, and thus, faciltiates evaporation of liquid condensate delivered to the structure from condensate collector 1330. Advantageously, the cooling apparatus embodiments of FIGS. 18A & 18B do not require the addition of a liquid condensate pump to move the liquid condensate from the condensate collector to the condensate evaporation system.

Figure 19:
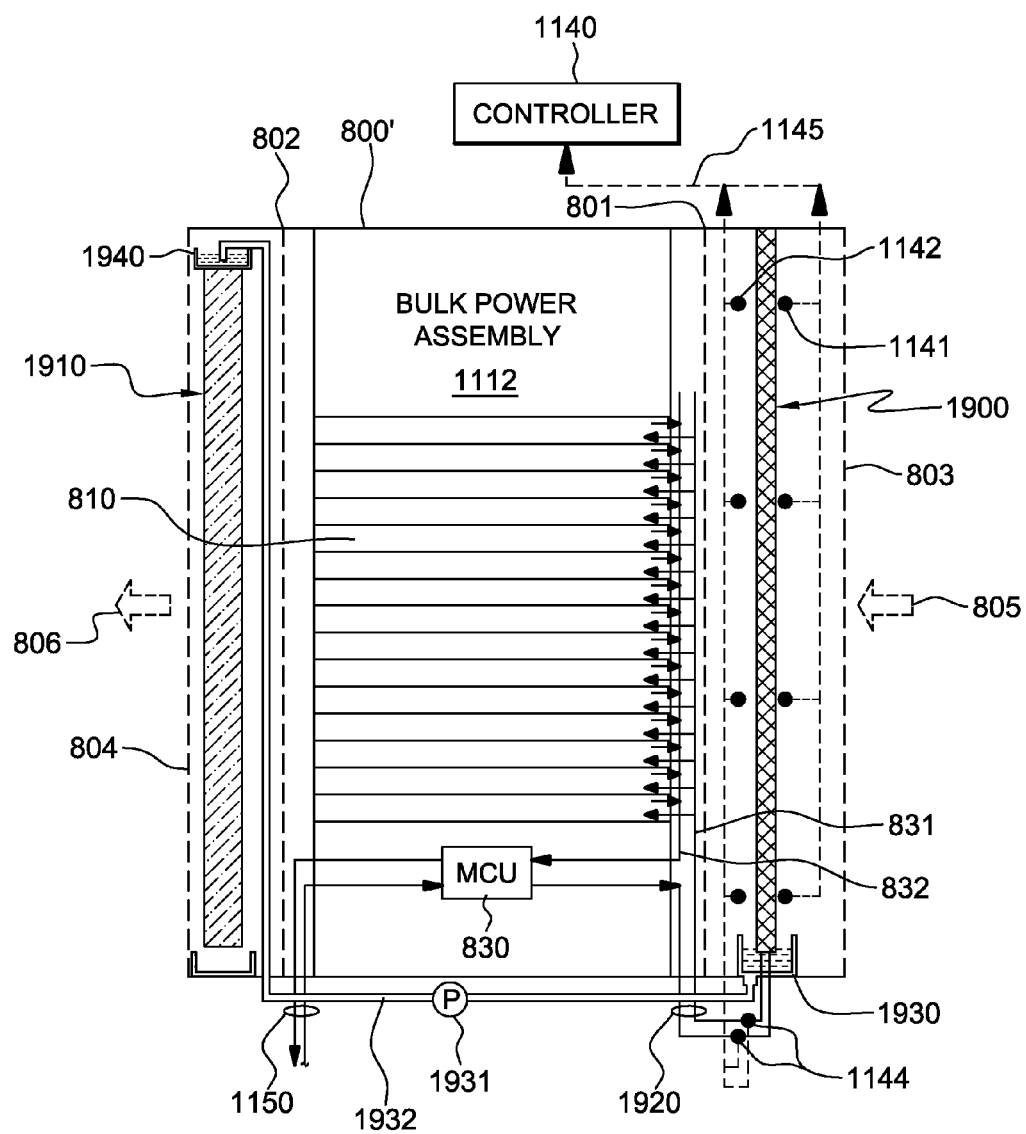
FIG. 19 is a cross-sectional elevational view of the liquid-cooled electronics rack of FIG. 12, and an alternate embodiment of a dehumidifying and re-humidifying cooling apparatus therefor, in accordance with an aspect of the present invention.

FIG. 19 illustrates a liquid-cooled electronics rack 800', such as described above in connection with FIGS. 8-12, which includes a dehumidifying and re-humidifying cooling apparatus, such as described above in connection with FIGS. 14A-16. As illustrated, ambient air 805 ingresses via an air inlet side 801 of electronics rack 800' through perforated front door 803, and humidified air 806 exits from air outlet side 802 of electronics rack 800' via perforated rear door 804. Electronic subsystems 810 are liquid-cooled via one or more modular cooling units 830, which provide chilled system coolant to respective coolant inlet and outlet manifolds 831, 832. Respective manifold-to-node fluid connect hoses couple the coolant inlet and return manifolds to the respective electronic subsystems 810. A facility coolant loop 1150 provides facility coolant to the liquid-to-liquid heat exchanger within each modular cooling unit 830.

In this implementation, the dehumidifying and re-humidifying cooling apparatus includes dehumidifying air-to-liquid heat exchanger 1900, which is cooled via coolant flowing through coolant loop 1920. The coolant within coolant loop 1920 is cooled via modular cooling unit 830. Dehumidifying air-to-liquid heat exchanger 1900 is configured and disposed so that air ingressing into the electronics rack passes across the dehumidifying air-to-liquid heat exchanger, and a re-humidifying structure 1910 is disposed at the air outlet side of electronics rack 800' and configured so that air egressing from the electronics rack passes through the re-humidifying structure 1910.

In this example, modular cooling unit 830 is assumed to chill the system coolant to a temperature below a dew point temperature of the ambient air entering the electronics rack, and this chilled coolant is first passed through the dehumidifying air-to-liquid heat exchanger 1900, and subsequently through the liquid-cooled electronic subsystems 810. Note that this coupling is provided by way of example only. Advantageously, in the embodiment of FIG. 19, the liquid-cooled electronic subsystems could be cooled with water significantly below the data center's ambient dew point, leading to a greater heat transfer capability of the modular cooling unit under relative humidity conditions which might be out-of-specification for the electronics rack.

In operation, dehumidifying air-to-liquid heat exchanger 1900, cooled via coolant passing through coolant loop 1920, dehumidifies ingressing ambient air into the electronics rack, and the resultant liquid condensate is collected in a condensate collector 1930 disposed at the bottom of the dehumidifying air-to-liquid heat exchanger. The liquid condensate is pumped 1931 through feed line 1932 to, for example, a condensate drip structure 1940, which drips the liquid condensate onto re-humidifying structure 1910, that is disposed at the air outlet side of the electronics rack. Re-humidifying structure 1910 humidifies and cools exhaust air egressing from the electronics rack. As described above, heat gained by the coolant at the dehumidifying air-to-liquid heat exchanger 1900 is via latent and sensible heat transfer phenomena, and this heat is subsequently rejected from the coolant via sensible heat transfer at the liquid-to-liquid heat exchanger of the modular cooling unit to the facility chilled water passing through the other side of the liquid-to-liquid heat exchanger.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronics rack, the apparatus comprising:
a dehumidifying air-to-liquid heat exchanger configured to reside at an air inlet side of the electronics rack, wherein the electronics rack comprises the air inlet side and an air outlet side, the air inlet side and the air outlet side respectively enabling ingress and egress of air through the electronics rack, and wherein the dehumidifying air-to-liquid heat exchanger is positioned for ingressing air to pass thereacross before passing through the electronics rack, the dehumidifying air-to-liquid heat exchanger being in fluid communication with a coolant loop for passing chilled coolant therethrough, and the dehumidifying air-to-liquid heat exchanger with chilled coolant passing therethrough dehumidifying ingressing air to the electronics rack to lower a dew point temperature of air flowing through the electronics rack;
a condensate collector disposed at the air inlet side of the electronics rack for collecting liquid condensate from the dehumidifying air-to-liquid heat exchanger's dehumidifying of ingressing air to the electronics rack; and
a condensate evaporation system for humidifying air egressing from the electronics rack, the condensate evaporation system being coupled in fluid communication with the condensate collector at the air inlet side of the electronics rack and evaporating liquid condensate received therefrom, the condensate evaporation system comprising a re-humidifying structure configured to reside at the air outlet side of the electronics rack so that air egressing from the air outlet side of the electronics rack passes through the re-humidifying structure, and a condensate delivery mechanism delivering liquid condensate from the condensate collector disposed at the air inlet side of the electronics rack to the re-humidifying structure disposed at the air outlet side of the electronics rack, the re-humidifying structure re-humidifying air egressing from the air outlet side of the electronics rack.

2. The apparatus of claim 1, further comprising a pumped-feed line coupling the condensate collector and the condensate evaporation system in fluid communication, and transferring liquid condensate from the condensate collector at the air inlet side of the electronics rack to the condensate evaporation system at the air outlet side of the electronics rack.

3. The apparatus of claim 1, wherein the condensate delivery mechanism sprays liquid condensate from the condensate collector onto the re-humidifying structure for re-humidifying air passing through the re-humidifying structure.

4. The apparatus of claim 1, wherein the condensate delivery mechanism provides a gravity drip of liquid condensate from the condensate collector onto the re-humidifying structure for re-humidifying air passing through the re-humidifying structure.

5. The apparatus of claim 1, wherein the re-humidifying structure of the condensate evaporation system comprises a wicking structure which facilitates dispensing of liquid condensate within the re-humidifying structure.

6. The apparatus of claim 5, wherein the wicking structure is disposed vertically at the air outlet side of the electronics rack to facilitate re-humidifying of air egressing from the electronics rack, and wherein the wicking structure is a porous wick material which wicks liquid condensate in a vertical direction at the air outlet side of the electronics rack to facilitate re-humidifying of air egressing from the electronics rack and passing therethrough.

7. The apparatus of claim 1, further comprising a modular refrigeration unit disposed within the electronics rack and at least one refrigerant evaporator coupled in fluid communication therewith via a refrigerant loop for passing refrigerant through the at least one refrigerant evaporator for cooling at least one electronic component within the electronics rack coupled thereto, the at least one refrigerant evaporator, the at least one electronic component coupled thereto, or the refrigerant loop comprising a surface cooled to a temperature below a dew point temperature of the ingressing air prior to dehumidifying thereof by the dehumidifying air-to-liquid heat exchanger.

8. The apparatus of claim 7, further comprising a liquid-to-liquid heat exchanger coupled to the coolant loop and to the refrigerant loop for facilitating cooling of coolant flowing through the coolant loop via refrigerant flowing through the refrigerant loop, and a pump in fluid communication with the coolant loop for pumping coolant through the dehumidifying air-to-liquid heat exchanger.

9. The apparatus of claim 8, further comprising a controller coupled to the pump, the controller controlling coolant flow rate through the coolant loop as a function of a determined dew point temperature of air exiting the dehumidifying air-to-liquid heat exchanger and a determined coolest surface temperature of at least one surface of (or coupled to) the at least one refrigerant evaporator, the at least one electronic component coupled thereto, or the refrigerant loop, and the controller at least one of determines whether a difference in temperature between the determined coolest surface temperature and the determined dew point temperature of air exiting the dehumidifying air-to-liquid heat exchanger is less than a first predetermined threshold, and if so, the controller automatically increases pump speed to increase the flow of coolant through the dehumidifying air-to-liquid heat exchanger, or determines whether the difference between the coolest surface temperature and the determined dew point temperature of air exiting the dehumidifying air-to-liquid heat exchanger is greater than a second predefined threshold, and if so, the controller automatically reduces pump speed to reduce the flow of coolant through the dehumidifying air-to-liquid heat exchanger.

10. The apparatus of claim 7, wherein the coolant loop is coupled in fluid communication with the refrigerant loop and the coolant flowing through the dehumidifying air-to-liquid heat exchanger is the refrigerant.

11. The apparatus of claim 7, wherein the coolant loop is coupled to a coolant distribution unit external to the electronics rack, the coolant loop providing chilled coolant to the dehumidifying air-to-liquid heat exchanger and expelling heat from the dehumidifying air-to-liquid heat exchanger to a facility coolant loop passing through the coolant distribution unit, and wherein the apparatus further comprises a controller for controlling an amount of dehumidifying of ingressing air to the electronics rack to control the dew point temperature of the air flowing through the electronics rack.

12. The apparatus of claim 1, further comprising a modular cooling unit associated with the electronics rack for facilitating liquid cooling of at least one electronic component of the electronics rack, the modular cooling unit receiving facility coolant from a source via a facility coolant loop and expelling heat in a liquid-to-liquid heat exchanger from the at least one electronic component to the facility coolant in the facility coolant loop, wherein the coolant loop is coupled to the liquid-to-liquid heat exchanger for cooling coolant passing therethrough, the coolant loop passing the chilled coolant to the dehumidifying air-to-liquid heat exchanger and to at least one cold plate coupled to the at least one electronic component to be cooled by the modular cooling unit.

13. An apparatus for facilitating cooling of an electronics rack, the apparatus comprising:
a dehumidifying air-to-liquid heat exchanger configured to reside at an air inlet side of the electronics rack, wherein the electronics rack comprises an air inlet side and an air outlet side, the air inlet side and the air outlet side respectively enabling ingress and egress of air through the electronics rack, and wherein the dehumidifying air-to-liquid heat exchanger is configured and positioned for ingressing air to pass thereacross before passing through the electronics rack, the dehumidifying air-to-liquid heat exchanger being in fluid communication with a coolant loop for passing chilled coolant therethrough, and the dehumidifying air-to-liquid heat exchanger with chilled coolant passing therethrough dehumidifying ingressing air to the electronics rack to lower a dew point temperature of the air flowing through the electronics rack;
a condensate collector disposed at the air inlet side of the electronics rack for collecting liquid condensate from the dehumidifying air-to-liquid heat exchanger's dehumidifying of ingressing air to the electronics rack; and
a condensate evaporation system coupled in fluid communication with the condensate collector at the air inlet side of the electronics rack and evaporating liquid condensate received therefrom, the condensate evaporation system comprising a humidifying structure for evaporating liquid condensate, and a condensate delivery mechanism delivering liquid condensate from the condensate collector disposed at the air inlet side of the electronics rack to the humidifying structure for evaporating liquid condensate.

14. The apparatus of claim 13, wherein the electronics rack is disposed in a data center having a raised floor, and wherein the humidifying structure is disposed beneath the raised floor for evaporating liquid condensate beneath the raised floor by humidifying air passing therethrough.

15. The apparatus of claim 14, wherein the humidifying structure of the condensate evaporation system comprises a wicking structure which wicks liquid condensate in a vertical direction substantially perpendicular to a direction of airflow beneath the raised floor, the wicking structure comprising a porous wick material.

16. A cooled electronic system comprising:
an electronics rack, the electronics rack comprising:
an air inlet side and an air outlet side, the air inlet and air outlet sides respectively enabling ingress and egress of air;
at least one electronic component requiring cooling;
at least one air-moving device, the at least one air-moving device causing air to flow from the air inlet side of the electronics rack through the electronics rack, to the air outlet side thereof; and
a dehumidifying and re-humidifying cooling apparatus for the electronics rack, the dehumidifying and re-humidifying cooling apparatus comprising:
a dehumidifying air-to-liquid heat exchanger disposed at the air inlet side of the electronics rack, the dehumidifying air-to-liquid heat exchanger being positioned for ingressing air to pass thereacross before passing through the electronics rack, and being in fluid communication with a coolant loop for passing chilled coolant therethrough, and wherein the dehumidifying air-to-liquid heat exchanger with chilled coolant passing therethrough dehumidifies ingressing air to the electronics rack to lower a dew point temperature of air flowing through the electronics rack;

a condensate collector disposed at the air inlet side of the electronics rack and collecting liquid condensate from the dehumidifying air-to-liquid heat exchanger's dehumidifying of ingressing air to the electronics rack; and a condensate evaporation system for humidifying air egressing from the electronics rack, the condensate evaporation system being coupled in fluid communication with the condensate collector at the air inlet side of the electronics rack and evaporating liquid condensate received therefrom, the condensate evaporation system comprising a re-humidifying structure disposed at the air outlet side of the electronics rack so that air egressing from the air outlet side of the electronics rack passes across the re-humidifying structure, and a condensate delivery mechanism delivering liquid condensate from the condensate collector disposed at the air inlet side of the electronics rack to the re-humidifying structure disposed at the air outlet side of the electronics rack, the re-humidifying structure re-humidifying air egressing from the air outlet side of the electronics rack.

17. The cooled electronic system of claim 16, wherein the dehumidifying and re-humidifying cooling apparatus further comprises a pumped-feed line coupling the condensate collector and the condensate evaporation system in fluid communication, and transferring liquid condensate from the condensate collector at the air inlet side of the electronics rack to the condensate evaporation system at the air outlet side of the electronics rack.

18. The cooled electronic system of claim 16, wherein the condensate delivery mechanism sprays liquid condensate from the condensate collector onto the re-humidifying structure for re-humidifying air passing through the re-humidifying structure.

19. The cooled electronic system of claim 16, wherein the condensate delivery mechanism provides a gravity drip of liquid condensate from the condensate collector onto the re-humidifying structure for re-humidifying air passing through the re-humidifying structure.

20. The cooled electronic system of claim 16, wherein the re-humidifying structure of the condensate evaporation system comprises a wicking structure which facilitates dispersing of liquid condensate within the re-humidifying structure.

21. The cooled electronic system of claim 20, wherein the wicking structure is disposed vertically at the air outlet side of the electronics rack to re-humidify air egressing from the electronics rack, and wherein the wicking structure is a porous wick material which wicks liquid condensate in a vertical direction at the air outlet side of the electronics rack to facilitate re-humidifying of air egressing from the electronics rack and passing therethrough.

22. The cooled electronic system of claim 16, further comprising a modular refrigeration unit disposed within the electronics rack and at least one refrigerant evaporator coupled in fluid communication therewith via a refrigerant loop for passing refrigerant through the at least one refrigerant evaporator for cooling at least one electronic component within the electronics rack coupled thereto, the refrigerant evaporator, the at least one electronic component coupled thereto or the refrigerant loop comprising a surface cooled to a temperature below a dew point temperature of the ingressing air prior to dehumidifying thereof by the dehumidifying air-to-liquid heat exchanger, wherein the dehumidifying avoids formation of condensation on the surface cooled below dew point of the ingressing air prior to dehumidifying thereof.

23. The cooled electronic system of claim 16, wherein the coolant loop of the dehumidifying and re-humidifying cooling apparatus is coupled to a coolant distribution unit external to the electronics rack, the coolant loop providing chilled coolant to the dehumidifying air-to-liquid heat exchanger and expelling heat from the dehumidifying air-to-liquid heat to a facility coolant loop passing through the coolant distribution unit, and wherein the dehumidifying and re-humidifying cooling apparatus further comprises a controller for controlling an amount of dehumidifying of ingressing air to the electronics rack to control the dew point temperature of the air flowing through the electronics rack.

24. The cooled electronic system of claim 16, further comprising a modular cooling unit associated with the electronics rack for facilitating liquid cooling of at least one electronic component of the electronics rack, the modular cooling unit receiving facility coolant from a source via a facility coolant loop and expelling heat in a liquid-to-liquid heat exchanger from the at least one electronic component to the facility coolant in the facility coolant loop, wherein the coolant loop is coupled to the liquid-to-liquid heat exchanger for cooling coolant passing therethrough, the coolant loop passing the chilled coolant to the dehumidifying air-to-liquid heat exchanger and to at least one cold plate coupled to the at least one electronic component to be cooled by the modular cooling unit.

25. A method of facilitating cooling of an electronics rack, the method comprising:

disposing a dehumidifying air-to-liquid heat exchanger at an air inlet side of the electronics rack, wherein the electronics rack comprises the air inlet side and an air outlet side, the air inlet side and air outlet side respectively enabling ingress and egress of air through the electronics rack, and the dehumidifying air-to-liquid heat exchanger is positioned for ingressing air to pass thereacross before passing through the electronics rack, the dehumidifying air-to-liquid heat exchanger being in fluid communication with a coolant loop for passing chilled coolant therethrough, and the dehumidifying air-to-liquid heat exchanger with chilled coolant passing therethrough dehumidifying ingressing air to the electronics rack to lower a dew point temperature of air flowing through the electronics rack;

disposing a re-humidifying structure to the air outlet side of the electronics rack so that air egressing from the air outlet side of the electronics rack passes through the re-humidifying structure;

collecting liquid condensate from the dehumidifying air-to-liquid heat exchanger's dehumidifying of ingressing air to the electronics rack;

delivering the liquid condensate from the air inlet side of the electronics rack to the re-humidifying structure at the air outlet side thereof; and evaporating at the air outlet side of the electronics rack, the liquid condensate delivered to the re-humidifying structure to humidify air egressing from the electronics rack.

* * * * *